US012657354B2

(12) United States Patent
Bhuiyan et al.

(10) Patent No.: US 12,657,354 B2
(45) Date of Patent: Jun. 16, 2026

(54) FRACTURE DENSITY MODEL SYSTEM, METHODS, AND APPARATUSES

(71) Applicant: Dyno Nobel Inc., Salt Lake City, UT (US)

(72) Inventors: A B M Abdul Ali Bhuiyan, Salt Lake City, UT (US); Charles Michael Lownds, Salt Lake City, UT (US); Dale S. Preece, Saratoga Springs, UT (US)

(73) Assignee: Dyno Nobel Inc., Salt Lake City, UT (US)

( * ) Notice: Subject to any disclaimer, the term of this patent is extended or adjusted under 35 U.S.C. 154(b) by 1169 days.

(21) Appl. No.: 17/517,226

(22) Filed: Nov. 2, 2021

(65) Prior Publication Data

US 2024/0232450 A1     Jul. 11, 2024

Related U.S. Application Data

(60) Provisional application No. 63/109,033, filed on Nov. 3, 2020.

(51) Int. Cl.
*G06F 30/17*            (2020.01)
(52) U.S. Cl.
CPC ................................... *G06F 30/17* (2020.01)
(58) Field of Classification Search
CPC ...... G06F 30/17; G06F 30/23; G06F 2111/10; G06F 2119/14; E21B 2200/20
See application file for complete search history.

(56) References Cited

U.S. PATENT DOCUMENTS

| | | | |
|---|---|---|---|
| 9,316,568 B2 | 4/2016 | He et al. | |
| 10,072,919 B1 | 9/2018 | Srinivasan et al. | |
| 2010/0256957 A1* | 10/2010 | Slavik | G06F 30/23 |
| | | | 703/2 |
| 2011/0077918 A1* | 3/2011 | Mutlu | G01V 9/00 |
| | | | 703/2 |

(Continued)

FOREIGN PATENT DOCUMENTS

| | | |
|---|---|---|
| CN | 103412112 B | 12/2014 |
| EP | 2835627 A1 | 2/2015 |
| JP | 2672209 B2 | 11/1997 |

OTHER PUBLICATIONS

Preece, Dale, and Stewart A. Silling. Ore Loss and Dilution Studies of Surface Mineral Blasting with 3D Distinct Element Heave Models. No. SAND2016-1317C. Sandia National Lab.(SNL-NM), Albuquerque, NM (United States), 2016. 14 Pages. (Year: 2016).*

(Continued)

*Primary Examiner* — Eunhee Kim
(74) *Attorney, Agent, or Firm* — Dorsey & Whitney LLP

(57)                    ABSTRACT

A fracture density model (FDM) system may predict the fragmentation size distribution for a blast. The FDM system may generate a model comprising a plurality of volume elements. The FDM system may determine pre-existing joint fractures in the volume elements. The FDM system may also simulate blasts and track fractures, for each of the volume elements, caused by the shock wave of the blast and a shock wave reflected off of a free face of the model. The FDM system may combine the pre-existing joint fractures and the blast induced fractures to determine a predicted fragmentation size for the distinct elements.

19 Claims, 14 Drawing Sheets

(56)                    References Cited

U.S. PATENT DOCUMENTS

| | | | |
|---|---|---|---|
| 2013/0298795 A1* | 11/2013 | Brent ........................ | F42D 3/04 |
| | | | 102/312 |
| 2020/0132882 A1 | 4/2020 | Runkana et al. | |
| 2020/0250355 A1 | 8/2020 | Giltner et al. | |
| 2024/0232450 A1 | 7/2024 | Bhuiyan et al. | |

OTHER PUBLICATIONS

Chen, Baobao, Changyou Liu, and Jingxuan Yang. "Design and application of blasting parameters for presplitting hard roof with the aid of empty-hole effect." Shock and Vibration Jan. 2018 (2018): 8749415. 16 Pages. (Year: 2018).*

Bhagade, Nachiket V., and V. M. S. R. Murthy. "Controlling backbreak and enhancing fragmentation in dragline bench blasting—a geo-engineering approach." Arabian Journal of Geosciences 13.7 (2020): 304. 20 Pages. (Year: 2020).*

Latham, J. P., et al. "Blast fragmentation in rock with discontinuities using an equation of state gas model coupled to a transient dynamics fracturing and fragmenting FEMDEM model." ARMA US Rock Mechanics/Geomechanics Symposium. ARMA, 2017. 12 Pages. (Year: 2017).*

Ouchterlony F, Sanchidrián JA. A review of the development of better prediction equations for blast fragmentation. Rock Dynamics and Applications 3. Jun. 18, 2018:25-45. (Year: 2018).*

Babanouri N, Abdolahpour M, Dehghani H. Modeling blast-induced fragmentation of jointed rock mass using voronoi discrete-element method. International Journal of Geomechanics. Aug. 1, 2020;20(8):04020117. (Year: 2020).*

Examination Report from Saudi Arabia dated Feb. 21, 2025 for Application No. 523440642.

International Preliminary Report dated May 8, 2023 for PCT/US2021/057767.

International Search Report & Written Opinion dated Feb. 21, 2022 for PCT Application No. PCT/US2021/057767.

Lownds , et al., "Computer Modeling of Fragmentation in Blasting Using a 3-Dimentional Array of Fracture Intensities", Proceedings of Minnesota's 1st International Surface Blasting Conference, Duluth, MN, Jun. 7-11, 1999.

Lownds , et al., "Derivation of Fracture Intensity from Measured Fragmentation", 12th Annual Symposium on Explosives and Blasting Research, International Society of Explosives Engineers, 1996.

Lownds , et al., "Effects of Blasting on Milling", Proceeding 70th Annual Meeting Minnesota Section of SME, Apr. 1997, 27-34.

Lownds , et al., "Prediction of Fragmentation Based o Distribution of Explosives", Research Symposium of International Society of Explosives Engineers Meeting, Feb. 1995.

Lownds , et al., "The Effect of Powder Factor on Fragmentation", ISEE, 1997.

Extended European Search Report dated Sep. 10, 2024 for EP21889926.8.

Trivino , et al., "Assessment of Crack Initiation and Propagation in Rock from Explosion-Induced Stress Waves and Gas Expansion by Cross-Hole Seismometry and FEM-DEM Method", International Journal of Rock Mechanics & Mining Sciences, 77, 2015, 287-299.

Xia , et al., "Safety Threshold of Blasting Vibration Velocity in Foundation Excavation of Baihetan Super-High Arch Dam", Bulletin of Engineering Geology and the Environment, 79, 2020, 4999-5012.

* cited by examiner

FDM Block

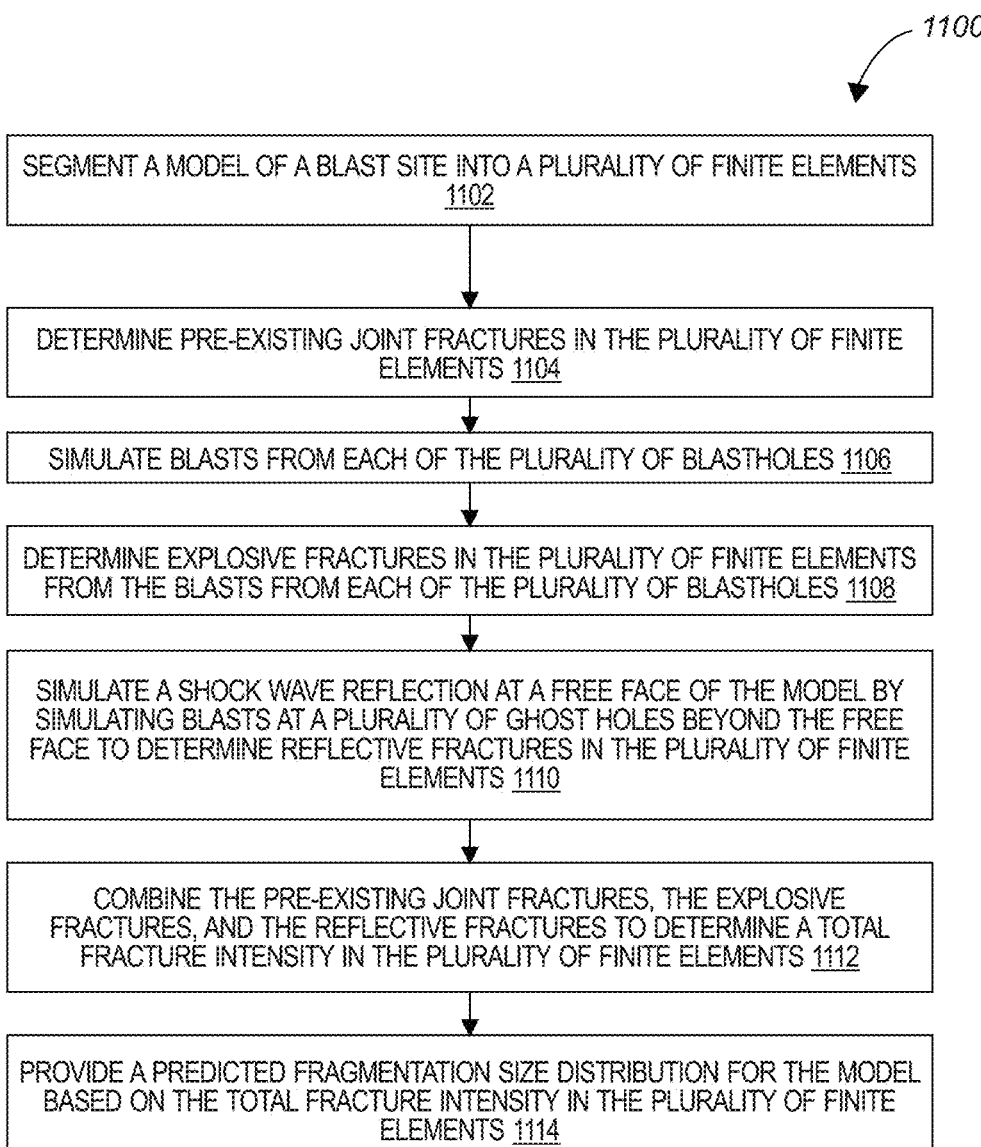

_1100_

SEGMENT A MODEL OF A BLAST SITE INTO A PLURALITY OF FINITE ELEMENTS
1102

DETERMINE PRE-EXISTING JOINT FRACTURES IN THE PLURALITY OF FINITE
ELEMENTS 1104

SIMULATE BLASTS FROM EACH OF THE PLURALITY OF BLASTHOLES 1106

DETERMINE EXPLOSIVE FRACTURES IN THE PLURALITY OF FINITE ELEMENTS
FROM THE BLASTS FROM EACH OF THE PLURALITY OF BLASTHOLES 1108

SIMULATE A SHOCK WAVE REFLECTION AT A FREE FACE OF THE MODEL BY
SIMULATING BLASTS AT A PLURALITY OF GHOST HOLES BEYOND THE FREE
FACE TO DETERMINE REFLECTIVE FRACTURES IN THE PLURALITY OF FINITE
ELEMENTS 1110

COMBINE THE PRE-EXISTING JOINT FRACTURES, THE EXPLOSIVE
FRACTURES, AND THE REFLECTIVE FRACTURES TO DETERMINE A TOTAL
FRACTURE INTENSITY IN THE PLURALITY OF FINITE ELEMENTS 1112

PROVIDE A PREDICTED FRAGMENTATION SIZE DISTRIBUTION FOR THE MODEL
BASED ON THE TOTAL FRACTURE INTENSITY IN THE PLURALITY OF FINITE
ELEMENTS 1114

FIG. 11

Mass %Passing

FRAC_INT_N

Fracture Intensity

FRACTURE DENSITY MODEL SYSTEM, METHODS, AND APPARATUSES

RELATED APPLICATIONS

This application claims priority to U.S. Provisional Patent Application No. 63/109,033, entitled FRACTURE DENSITY MODEL SYSTEM, METHODS, AND APPARATUSES, filed Nov. 3, 2020, which is hereby incorporated by reference in its entirety.

TECHNICAL FIELD

The present disclosure relates generally to explosives. More specifically, the present disclosure relates to methods, systems, and apparatuses for predicting fragmentation size of rocks from a blast.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 11 illustrates a flow chart of a method for predicting rock fragmentation size resulting from a blast in accordance with one embodiment.

DETAILED DESCRIPTION

Figures 1A, 1B:
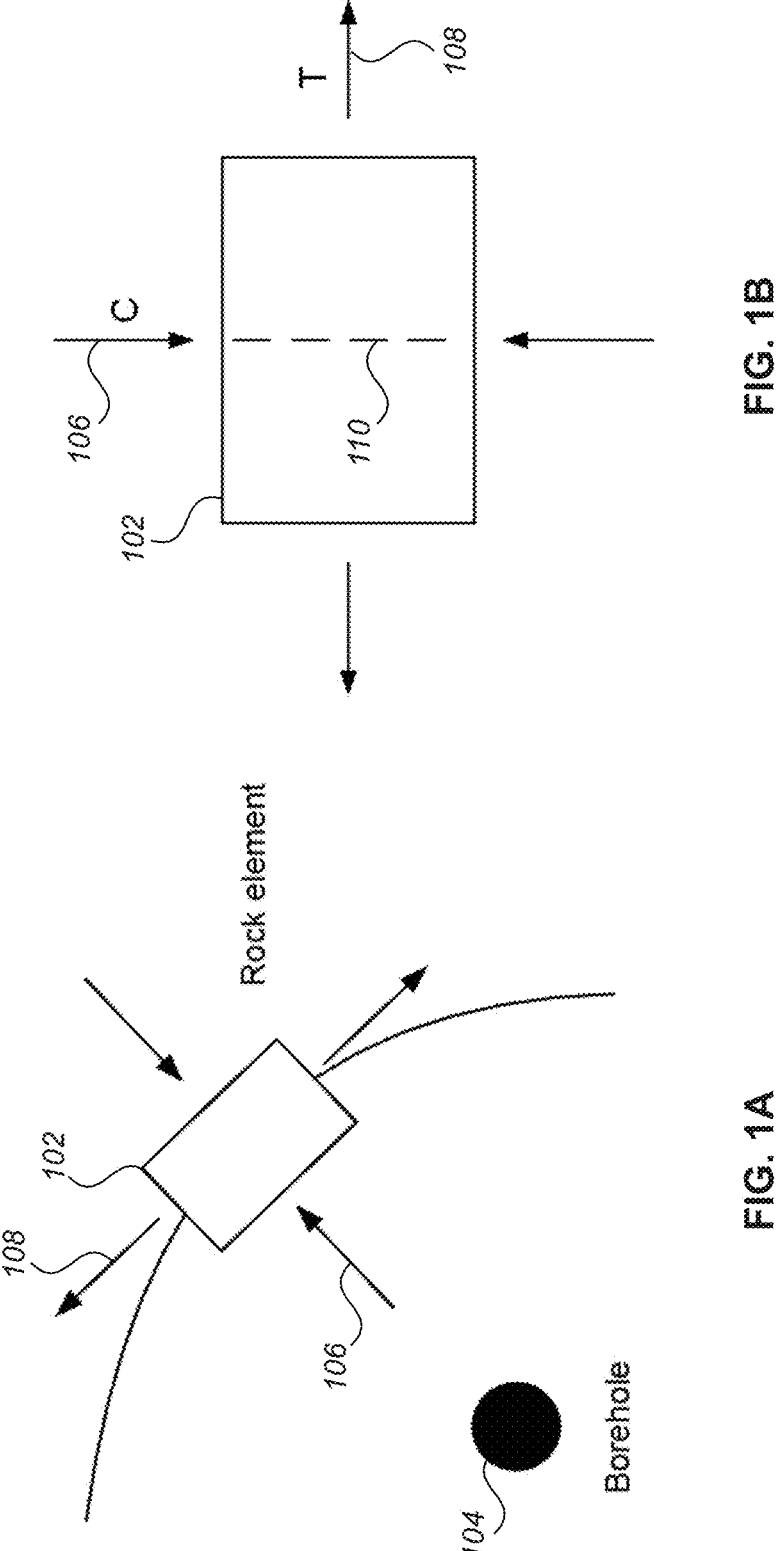
FIG. 1A illustrates the stresses placed on the rock element by a shock wave emitted from the blasthole in accordance with one embodiment.
FIG. 1B illustrates a resulting radial crack or fracture in the rock element in accordance with one embodiment.

Explosives are commonly used in the mining, quarrying, and excavation industries for breaking rocks and ore. Generally, a hole, referred to as a "blasthole," is drilled in a surface, such as the ground. Explosives may then be placed within the blasthole. Typically, multiple blastholes are used for breaking large amounts of rocks and ore. Using multiple blastholes introduces complexities for planning for a blast. For example, a blast may vary based on a plurality of factors including blasthole spacing, blasthole burden, blasthole depth, blasthole pattern, the number of blastholes, geological properties, the type of explosive, the amount of explosive, and the blasthole initiation time. The number of possibilities makes blast planning difficult, even for a highly trained blast engineer.

Blast simulations performed by modeling systems may be used to predict an outcome of a blast. For example, some modeling systems may predict the fragmentation size distribution of a blast. The fragmentation size distribution may predict the sizes of the rocks after the blast. Rock fragmentation from blasting is one of the key results in mining operations. Optimization of fragmentation can significantly improve all downstream mining and comminution processes. Accurate prediction of fragment size distribution based on all relevant blast inputs helps in the optimization process.

Embodiments herein generate a three-dimensional (3D) model of rock fragmentation. The model may be referred to as a Fracture Density Model (FDM). A modeling system may generate FDM by segmenting a model of a blast site into a plurality of elements, simulating blasts, and tracking fragmentation occurring in each of the plurality of elements. In some embodiments, the modeling system can treat complex physical scenarios including pre-existing joints, backbreak, dynamic free face, varying blast parameters, and reflection of waves at the free faces. Additionally, in some embodiments FDM may also be extended to simulate rock blasting in an underground environment.

As used herein, 3D FDM elements are elements of a 3D FDM model. 3D FDM elements are referred to herein as "finite elements", "volume elements", "a plurality of volume elements", "discrete elements", "a plurality of discrete elements", "a plurality of elements", "a plurality of distinct elements," "elements", and "rock elements." Each of these terms refer the 3D FDM elements of a 3D FDM model.

It will be readily understood that the components of the embodiments as generally described below and illustrated in the Figures herein could be arranged and designed in a wide variety of different configurations. For instance, the steps of a method do not necessarily need to be executed in any specific order, or even sequentially, nor do the steps need to be executed only once. Thus, the following more detailed description of various embodiments, as described below and represented in the Figures, is not intended to limit the scope of the disclosure but is merely representative of various embodiments. While the various aspects of the embodiments are presented in the drawings, the drawings are not necessarily drawn to scale unless specifically indicated.

Embodiments and implementations of systems and methods described herein may include various steps, which may be embodied in machine-executable instructions to be executed by a computer system. A computer system may include one or more general-purpose or special-purpose computers (or other electronic devices). The computer system may include hardware components that include specific logic for performing the steps or may include a combination of hardware, software, and/or firmware.

Embodiments may be provided as a computer program product including a computer-readable medium having stored thereon instructions that may be used to program a computer system or other electronic device to perform the processes described herein. The computer-readable medium may include, but is not limited to: hard drives, floppy diskettes, optical disks, CD-ROMs, DVD-ROMs, ROMs, RAMS, EPROMS, EEPROMs, magnetic or optical cards, solid-state memory devices, or other types of media/computer-readable media suitable for storing electronic instructions.

Computer systems and the computers in a computer system may be connected via a network. Suitable networks for configuration and/or use as described herein include one or more local area networks, wide area networks, metropolitan area networks, and/or Internet or IP networks, such as the World Wide Web, a private Internet, a secure Internet, a value-added network, a virtual private network, an extranet, an intranet, or even stand-alone machines which communicate with other machines by physical transport of media. In particular, a suitable network may be formed from parts or entireties of two or more other networks, including networks using disparate hardware and network communication technologies.

One suitable network includes a server and several clients; other suitable networks may contain other combinations of servers, clients, and/or peer-to-peer nodes, and a given computer system may function both as a client and as a server. Each network includes at least two computers or computer systems, such as the server and/or clients. A computer system may include a workstation, laptop computer, disconnectable mobile computer, server, mainframe, cluster, so-called "network computer" or "thin client," tablet, smart phone, personal digital assistant or other hand-held computing device, "smart" consumer electronics device or appliance, medical device, or a combination thereof.

Suitable networks may include communications or networking software, such as the software available from Novell®, Microsoft®, and other vendors, and may operate using TCP/IP, SPX, IPX, and other protocols over twisted pair, coaxial, or optical fiber cables; telephone lines; radio waves; satellites; microwave relays; modulated AC power lines; physical media transfer; and/or other data transmission "wires" known to those of skill in the art. The network may encompass smaller networks and/or be connectable to other networks through a gateway or similar mechanism.

Each computer system includes one or more processors and/or memory; computer systems may also include various input devices and/or output devices. The processor may include a general-purpose device, such as an Intel®, AMD®, or other "off-the-shelf" microprocessor. The processor may include a special-purpose processing device, such as an ASIC, SoC, SiP, FPGA, PAL, PLA, FPLA, PLD, or other customized or programmable device. The memory may include static RAM, dynamic RAM, flash memory, one or more flip-flops, ROM, CD-ROM, disk, tape, magnetic, optical, or other computer storage medium. The input device (s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The computer systems may be capable of using a floppy drive, tape drive, optical drive, magneto-optical drive, or other means to read a storage medium. A suitable storage medium includes a magnetic, optical, or other computer-readable storage device having a specific physical configuration. Suitable storage devices include floppy disks, hard disks, tape, CD-ROMs, DVDs, PROMs, RAM, flash memory, and other computer system storage devices. The physical configuration represents data and instructions which cause the computer system to operate in a specific and predefined manner as described herein.

Suitable software to assist in implementing the invention is readily provided by those of skill in the pertinent art(s) using the teachings presented here and programming languages and tools, such as Modern Fortran, Java, Pascal, C++, C, PHP, .Net, database languages, APIs, SDKs, assembly, firmware, microcode, and/or other languages and tools. Suitable signal formats may be embodied in analog or digital form, with or without error detection and/or correction bits, packet headers, network addresses in a specific format, and/or other supporting data readily provided by those of skill in the pertinent art(s).

Aspects of certain embodiments may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that performs one or more tasks or implement particular abstract data types. A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. According to one embodiment, a database management system (DBMS) allows users to interact with one or more databases and provides access to the data contained in the databases.

FIGS. 1A and 1B illustrate stresses on a rock element 102. Specifically, FIG. 1A illustrates the stresses placed on the rock element 102 by a shock wave emitted from the blast-hole 104, and FIG. 1B illustrates a resulting radial crack 110 or fracture in the rock element 102. Blast induced rock fragmentation is a complex physical process that involves many different physical phenomena such as the generation and propagation of shock waves, attenuation of shock waves into stress waves, crack formation and crack growth mechanism in rocks, explosives gas loading, rock heave movement, etc. These happen in a dynamic fashion within a fraction of a second. As a result, it is very difficult to capture these physical aspects of blasting using a single closed form analytical equation. Many numerical models have been suggested to represent the fragmentation by rock blasting. Some of the models have been more successful than others in terms of fragmentation prediction When the shock wave impacts on the wall of the bore hole, the strength of the wave far exceeds the compressive strength of rocks and thereby damages and crushes the rock at the borehole wall surface. As the shock wave propagates further from the blasthole 104, the intensity of the shock wave reduces, and the shock wave converts into stress waves. The stress wave exerts compressive stress 106 in the radial direction and tensile stress 108 in the tangential direction. In the illustrated embodiment, the tangential strength of rock element 102 is less than the compressive strength. As a result, the rock breaks due to the tensile stress 108 in the tangential direction and a radial crack 110 is formed. The high-pressure explosive gas penetrates the radial crack 110 and further extends/assist the breakage of rocks.

Figure 2B:
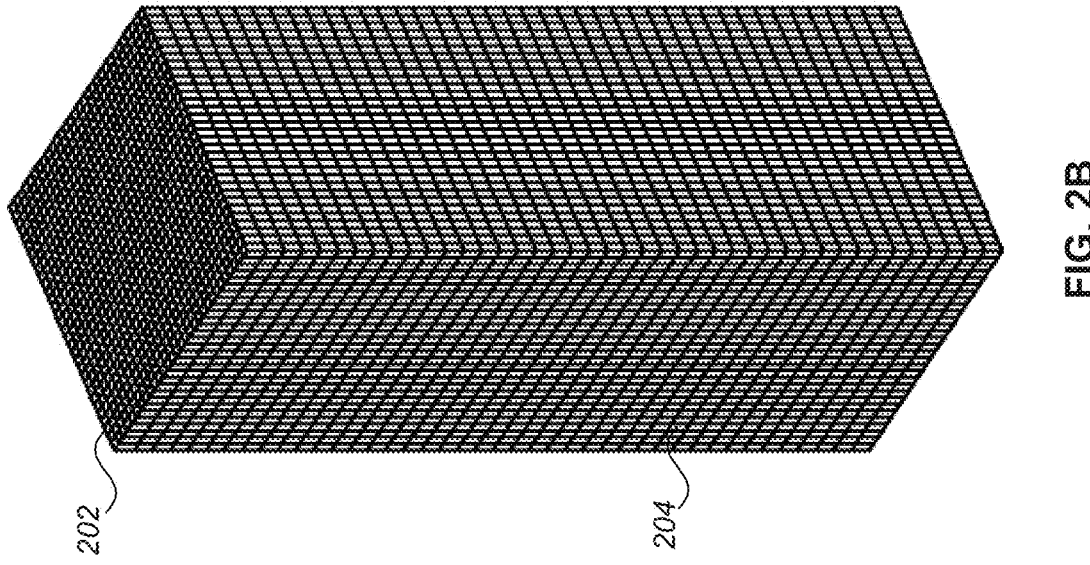
FIG. 2B illustrates the 3D model segmented into a plurality of volume elements in accordance with one embodiment.
Figure 2A:
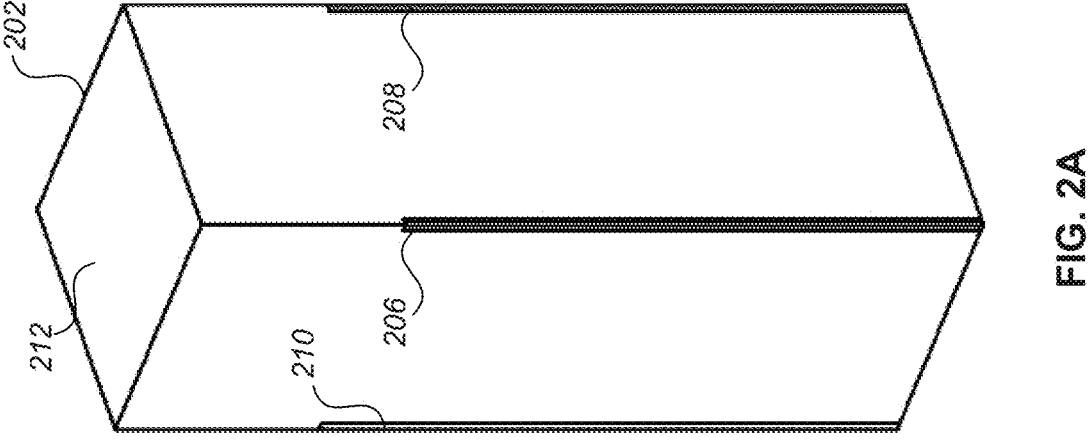
FIG. 2A illustrates a 3D model of a portion of a blast site in accordance with one embodiment.

FIG. 2A illustrates a 3D model 202 of a portion of a blast site. The 3D model 202 includes a blasthole at each corner (e.g., first blasthole 206, second blasthole 208, and third blasthole 210). While the illustrated embodiment shows blastholes on the corners of the 3D model 202, a plurality of blastholes may be included throughout a model of a blast site. The blastholes of the 3D model 202 do not extend the entire way to the surface 212 to model stemming for each blasthole.

To generate the 3D model 202, a modeling system may receive a plurality of inputs. The inputs may be received from a variety of sources. For example, the inputs may be received from a one or more of a human media interface (HMI), a previous model stored in the modeling system, a blast site scanning system, or default values stored in the modeling system. The inputs may include blasthole data and blasting site data. Blasthole data may include blasthole parameters such as blasthole spacing, blasthole burden, blasthole depth, blasthole diameter, blasthole pattern, the number of blastholes, stemming information, explosive properties, blasthole angle, blasthole position, row offsets, backbreak, front-row burden, top coordinates of the blasthole, bottom coordinates of the blasthole, subdrill information, and decking information.

Blasting site data may include bench information and geological properties of the blast site. Non-limiting examples of bench information includes face angle, bench height, bench dip, pit dip, free face location, and spoil angle. Non-limiting examples of geological properties include mineralogy (elemental and/or mineral), lithologic structure (primary, secondary, and/or texture), porosity, hardness, attenuation, Young's Modulus, Shear Modulus, Bulk Modulus, Poisson Ratio, P wave velocity, S wave velocity, rock density, rock type, rock strength, rock conditions, rock description, joint condition, joint angle, joint orientation, standard deviation of joint spacing, cohesion, vertical joint spacing, horizontal joint spacing, unconfined compressive strength (UCS), sonic velocity, standard deviation of drilling, shock velocity, fracture toughness of rock, reflectivity of rock, tensile strength of rock, internal friction angle, Hugoniot data (e.g., Up min, Up max, Us min, Us max), and ground stresses ($\sigma 1$, $\sigma 2$, $\sigma 3$, stress orientation, dip, direction, and roll). "Texture" refers to the size, shape, and arrangement of the interlocking mineral crystals which form a rock or other material. The geology properties may be used to determine further geologic characteristics, such as friability and fragmentability.

FIG. 2B illustrates the 3D model 202 segmented into a plurality of volume elements (e.g., element 204). The 3D model 202 may be segmented into as many or as few elements as desirable. A large number of elements may provide a better resolution for the simulation, while fewer elements may use fewer computational resources.

The modeling system may track the fractures from a simulated blast within each element. The resulting in a FDM may predict the fracture intensity within each element. Fracture intensity refers to the amount of fractures within a given area (e.g., the element). The fractures may be either natural joints or fractures caused by a shock wave from a blast. Fracture intensity may also be referred to as fracture frequency. By tracking the fracture intensity of each element, the modeling system may predict the fragment size.

Figures 3A, 3B:
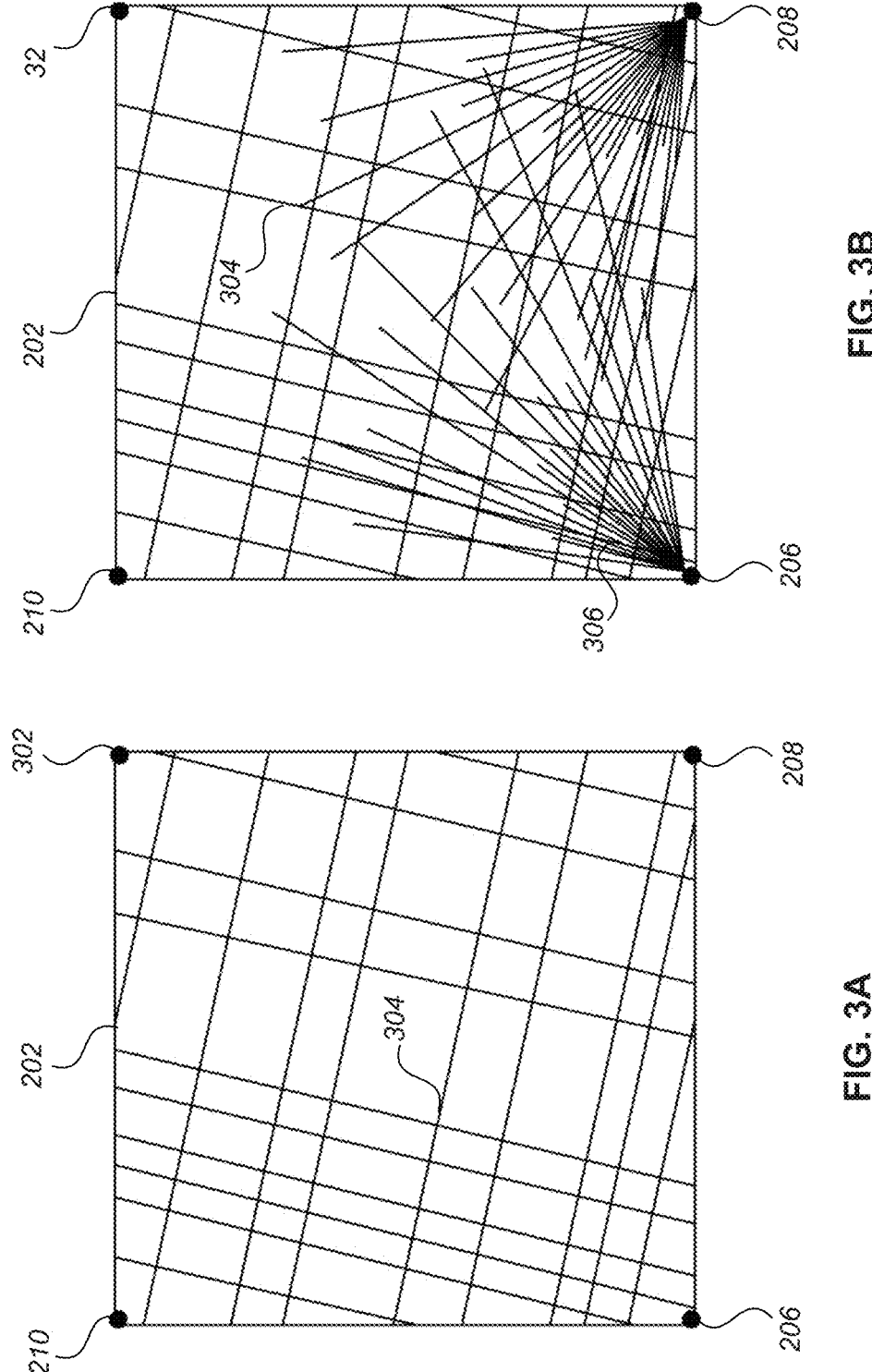
FIG. 3A illustrates a top planar view of the 3D model before any simulated blasts in accordance with one embodiment.
FIG. 3B illustrates a top planar view of the 3D model after simulated blasts from the first blasthole and the second blasthole in accordance with one embodiment.

FIG. 3A illustrates a top planar view of the 3D model 202 before any simulated blasts. As illustrated, the 3D model 202 includes a first blasthole 206, a second blasthole 208, a third blasthole 210, and a fourth blasthole 302. Additionally, the 3D model 202 includes natural joint sets 304 in the rock. The natural joint sets 304 are pre-existing joint fractures that are part of the geologic properties of the rock. In some embodiments the natural joint sets 304 may extend uniformly down the depth of the 3D model 202, while in other embodiments, the natural joint sets 304 may shift location and orientation throughout the 3D model 202. For example, different rock layers may be modeled with a different natural joint set.

FIG. 3B illustrates a top planar view of the 3D model 202 after simulated blasts from the first blasthole 206 and the second blasthole 208. As shown, the blasts result in fractures (i.e., explosive fractures 306) that extend from the blastholes.

A modeling system using FDM predicts fragment size of the rocks based on a fracture interaction between cracks from natural joint sets 304 present in the rock and blast induced fracturing (i.e., explosive fractures 306) from the blastholes. Cracks from the blastholes interact with each other and with the natural joint sets 304 in rock. These interactions may be used by a modeling system to determine an equivalent intensity of fractures.

As shown, the areas near the blastholes the explosive fractures 306 overwhelms the geology causes a lot of fractures within that area. The explosive fractures 306 spread out and become less dense the further they expand from the blastholes. In the area in between the blastholes the fracture interactions between the natural joint sets 304 and the explosive fractures 306 have more of an effect on the fragmentation of the rock. In these areas, a modeling system may take into account the additive effect of both the natural occurring fragmentation, the post-blast fragmentation, and even overlapping fragmentation from adjacent blastholes.

In some embodiments, the modeling system may take into account fractures from previous blasts in determining the fracture intensity. For example, in bench blasting after a row of blastholes is blasted, a new free face is created. While the row of blastholes is now gone, the modeling system may store fractures caused by the blast that are within the boundary of the new free face. The previous blast fractures may be added to the natural occurring fragments and the next-blast fragments.

The intensity of blast induced fracture may be predicted by an empirical equation which considers the physical aspects of the problem, such as: i) explosive properties ii) rock properties, iii) blast geometry, and iv) blast timing. One advantage of the fracture intensity concept is that intensities (defined as fractures per unit length) can be added if their angles to the free face are similar. Such addition may be valid regardless of the source of the equivalent fracture.

In some embodiments, the explosive induced fracture intensity may be:

$$\text{fracture intensity} = \frac{k}{r^3} \qquad \text{(EQUATION 1)}$$

where:

k is a site-specific calibration parameter that may be based on i) explosive properties ii) rock properties and iii) blast geometry r is the distance from hole in feet As shown, the fracture intensity is reduced rapidly based on the distance from the blasthole. For example, at a distance of one foot from the hole, the fracture frequency may be 4,000 fractures per foot. While at 16 feet, the fracture frequency may be reduced to just one fracture per foot.

In some embodiments, the explosive induced fracture intensity may be calculated by using the following equation:

$$F = K * F1 * F2 * F3 \qquad \text{(EQUATION 2)}$$

where:

F1 corresponds to rock and explosive properties, F2 gives the shape of the particle size distribution curve (e.g, a geometric term for a cylindrical charge), and F3 generates the intensity effect based on the distance of an element from the charge. K is a site-specific calibration parameter. The K parameter may depend on site specific rock fracture properties. The functions in equation (2) are shown below in detailed equations:

$$F1 = \left( \frac{\frac{\sigma_c^2}{2E}}{PF * EE} \right)^{\delta} \qquad \text{(EQUATION 3)}$$

$$F2 = \left[ \frac{R_0}{R} \left( \tan^{-1} \frac{HMX}{R} + \tan^{-1} \frac{XMS}{R} \right) \right]^{\alpha} \qquad \text{(EQUATION 4)}$$

$$F3 = \left( \frac{BR}{R_0} \right)^{\gamma} \qquad \text{(EQUATION 5)}$$

Where:

In F1, the numerator is the rock strength described by the strain energy density, and the denominator is the energy available from the explosives $R_0$ corresponds to the hole radius.

R is the radial orthogonal distance of an element from the hole.

BR is the distance of an element from the blasthole. (BR differs from R in stemming zone)

HMX and XMS are distance functions evaluated for different blasthole orientation using vector distance equations. HMX is the distance from the bottom of the charge to an element center (measured along the blasthole direction. XMS is the distance from the top of the charge to the element center (measured along the blasthole direction)

The exponents $\alpha$, $\gamma$, and $\delta$ are calibrated using test bench blast shots.

PF is powder factor.

EE is explosives energy.

As can be seen from equations 1-5, these functions are non-dimensional, which may allow embodiments more flexibility to use different unit systems such as: SI, CGS, etc. The inverse tangent functions in F2 may produce a desired shape of the fragment size distribution.

In order to calibrate equations and find out the best set of parameters (K, $\alpha$, $\gamma$, $\delta$), the root mean squared error (RMSE) between the experimental and a numerical dataset may be calculated. In some embodiments, many optimization iterations may be conducted to minimize the RMSE error and find a best parameter set to represent a blast. In some embodiments, the FDM system may customize the fracture density model to a blasting site using RMSE. For example, An RMSE study of a site may be accomplished by executing fracture density models a plurality of times (e.g., 1,000 simulations) while gradually changing the FDM fitting parameters (e.g., K, $\alpha$, $\gamma$, $\delta$). For the RMSE study, the system may compare the FDM results with the actual blast results from a specific site. The system may try to optimize FDM parameters (K, $\alpha$, $\gamma$, $\delta$) to match the actual blast data by running thousands of RMSE iterations. Using the simulations, the system may get the optimized RMSE fitting parameters for FDM (for that specific site). The RMSE study may result in tuned fitting parameters that may accurately predict the fragmentation produced by future blasting.

The fracture intensities from the explosive fractures 306 and the natural joint sets 304 may be combined to determine a total fracture intensity for each of the elements making up the 3D model 202. For example, for each element of the 3D model 202, the modeling system may add the explosive fractures 306 and the natural joint sets 304 located in an element to determine a total fracture intensity for each element.

In some embodiments, the interaction between fractures may be combined using a combination rule for FDM. The modeling system may predict intensity of fracture in a volume element using equation (2), and then combine the result with previous fracture intensities using the following equation 6.

$$I_r = (I_e + I_n) \cdot \cos^2(A_e - A_n) + \max(I_e, C \cdot I_n) \cdot \sin^2(A_e - A_n) \qquad \text{(EQUATION 6)}$$

Where:

$I_r$ is the resultant intensity of fracture in a volume element. $I_e$ and $A_e$ are existing fracture intensity and fracture angle respectively. Similarly, $I_n$ and $A_n$ correspond to the new fracture intensity and fracture angle. C is the "crack crossing factor", which is essentially a factor to reduce the intensity of fracture for orthogonal fracture intensities.

Generally parallel fractures may add up and increase the intensity. On the other hand, orthogonal fractures tend to reduce the intensity of fracture in a volume element. Fracture angle with higher intensity may be considered dominant and retained for next iteration. Determining the fracture angle is discussed with reference to FIG. 7A and FIG. 7B.

Using the total fracture intensity, the modeling system may determine fragmentation size. In some embodiments, the fragment size for each element may be determined by calculating:

$$\text{Fragment Size} = \frac{1}{F} \qquad \text{(EQUATION 7)}$$

where: F is the total fracture intensity

Figure 4:
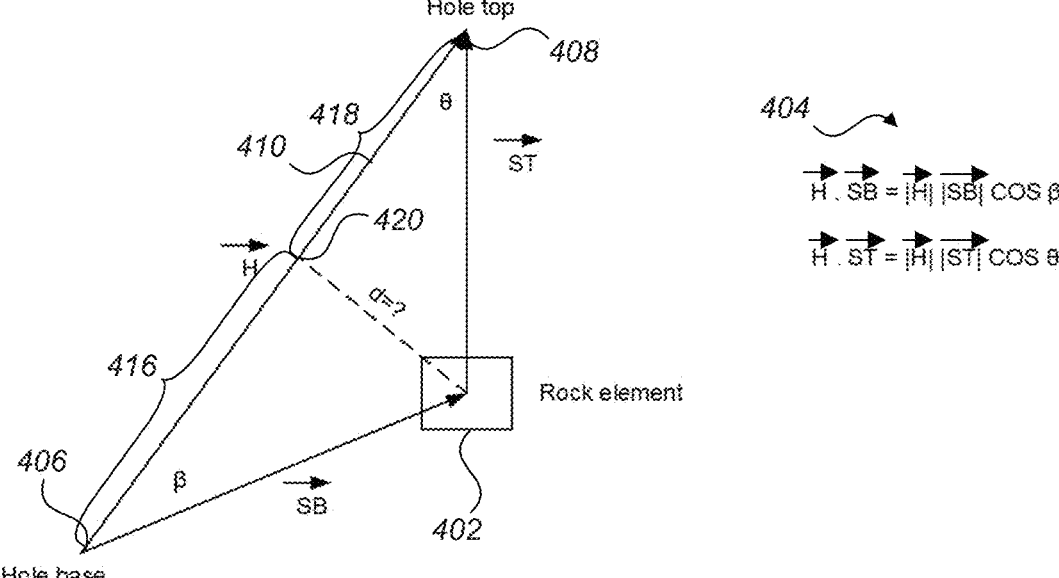
FIG. 4 illustrates vector mechanics equations that may be used in fracture density modeling (FDM) for calculation of distance functions and detection of charge positions with respect to a rock element in the blast, in accordance with one embodiment.

FIG. 4 illustrates vector mechanics equations 404 that may be used by an FDM system for calculation of distance functions and detection of charge positions with respect to a rock element in the blast. The vector mechanics equations 404 use an angle between the blasthole 410 and the rock element 402 at the hole base 406 and an angle between the blasthole 410 and the rock element 402 at the hole top 408. The vector mechanics equations 404 in the illustrated embodiments are:

$$\vec{H} \cdot \vec{SB} = |\overrightarrow{H}| \, |\overrightarrow{SB}| \cos \beta$$

$$\vec{H} \cdot \vec{ST} = |\overrightarrow{H}| \, |\overrightarrow{ST}| \cos \theta$$

Where:

H is a vector with the magnitude of blasthole length and direction from hole base to hole top SB is a vector drawn from the hole base to the element center ST is a vector drawn from the element center to the hole top The vector mechanics equations 404 may be used to solve HMX 416 and XMS 418 distances. HMX and XMS are distance functions that may be used in FDM. HMX is measured as the distance from hole base to the intersection point 420. XMS is measured as the distance from hole top 408 to intersection point 420. The intersection point 420 represents the intersection between a perpendicular line drawn from the center of the rock element 402 and the blast hole line as represented by the vector H. An FDM system may use H.SB and H.ST to calculate angles β and θ. Then, the system may use these angles (β and θ) and the direction cosines to mathematically calculate the distances HMX and XMS.

In some embodiments an FDM modeling system may use these vector mechanics equations 404 for the exact treatment of rock in different sub zones of the model. Using dot products and direction cosines, the modeling system may predict the intensity of fracture at different locations without explicitly defining blast parameters such as burden, spacing, stemming, sub drill, etc.

In some embodiments, the FDM modeling system can deal with any blasthole orientation and variable blast parameter using vector mechanics equations 404. Using the vector mechanics equations 404, the modeling system may be able to accurately predict distance functions and charge locations irrespective of the size, position, or orientation of the blasthole. For example, the vector mechanics equations 404 may be used to handle calculations for blasts with angled blastholes and variable charge lengths/positions.

Figure 5:
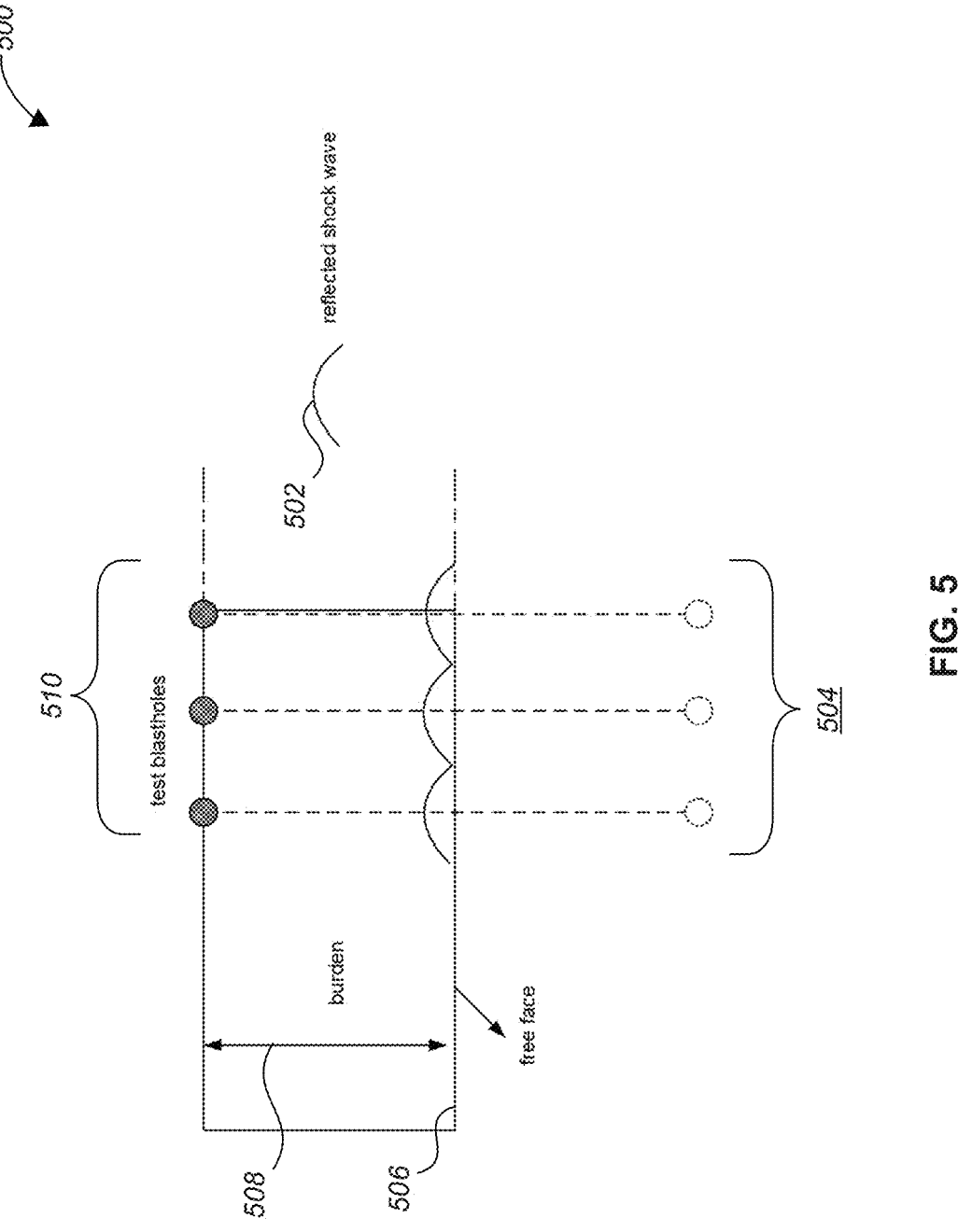
FIG. 5 illustrates a top planar view of a blast model with ghost holes to determine fractures and fracture intensity caused by reflected shock waves in each element of the blast model in accordance with one embodiment.

FIG. 5 illustrates a top planar view of a blast model 500 with ghost holes 504 to determine fractures and fracture intensity caused by reflected shock waves 502 in each element of the blast model 500. The blast model 500 is a model of a bench blast with a free face 506. Similar to 3D model 202 in FIG. 2B the blast model 500 may be 3D and include a plurality of distinct elements. Reflected shock waves 502 are caused when the shock wave from the blast reaches the free face 506 and top surface. In some embodiments, the variable reflectivity of the free faces may be set to 100%.

The ghost holes 504 may be placed equally distanced from free face 506 as the row of test blastholes 510. The test blastholes 510 are the blastholes currently under a blast simulation. The test blastholes 510 are spaced from the free face 506 by the distance of the burden 508. Accordingly, in the illustrated embodiment, the ghost holes 504 are positioned beyond the free face 506 by the distance of the burden 508. As the ghost holes 504 are beyond the free face 506, the ghost holes 504 are positioned in free space and not in direct contact with any rock elements of the blast model 500.

To simulate a blast from the test blastholes 510, a modeling system may initiate a blast from both of the test blastholes 510 and the ghost holes 504 at the same time. As a result of the simultaneous initiation and the placement of the ghost holes 504, when the shock waves from the test blastholes 510 reaches the free face 506 the shock waves from the ghost holes 504 acts as the reflected shock waves 502 for the blast simulation. Thus, the modeling system may use the reflected shock waves 502 to simulate the shock waves from the ghost holes 504. In some embodiments, the modeling system may assume that the reflectivity of the free faces is 100%. Thus, the ghost holes 504 shock wave may be equivalent in magnitude to the shock wave from the test blastholes 510. In other words, the equations discussed with reference to FIG. 3B may be used to calculate the fracture intensity from each of the test blastholes 510 and each of the ghost holes 504.

The ghost holes 504 may be shaped the same as the test blastholes 510. For example, the ghost holes 504 may have a same diameter and depth as the test blastholes 510. In some embodiments, the ghost holes 504 may be simulated to radiate a shock wave the length of the charge of the test blastholes 510. In other embodiments, the ghost holes 504 may be simulated to radiate a shock wave the length of charge and stemming of the test blastholes 510.

In some embodiments, additional ghost holes may be used to model reflection off of the top surface of the blast model for example, ghost holes may be placed a distance from the top surface equal to the length of the stemming region. These ghost holes may be referred to as stemming ghost holes and may generate reflected shock waves in the stemming zone. These ghost holes simulate the reflection of shock waves at the top surface of the blasts.

In some embodiments, the test blastholes 510 may be positioned based on actual scan or GPS data of an already drilled blast site. In some embodiments, the test blastholes 510 may be based on a previously blasted site, and take into account blastholes that were overcharged, undercharged, failed to detonate properly, were partially filled with water, or otherwise had atypical detonations. This data can be input into the model to predict fragmentation post-blast.

The reflected shock waves 502 that is generated at the ghost holes 504 may have a different angle than the shock waves from the test blastholes 510. For example, in one embodiment the reflected shock waves 502 from the plurality of ghost holes 504 is modeled as a tensile wave with a first angle and the shock wave from the plurality of test blastholes 510 is modeled as a compressive wave at a second angle.

Ghost holes 504 can also be used by a modeling system to create dynamic free faces as discussed with reference to FIG. 6. (see FIG. 6).

Figure 6:
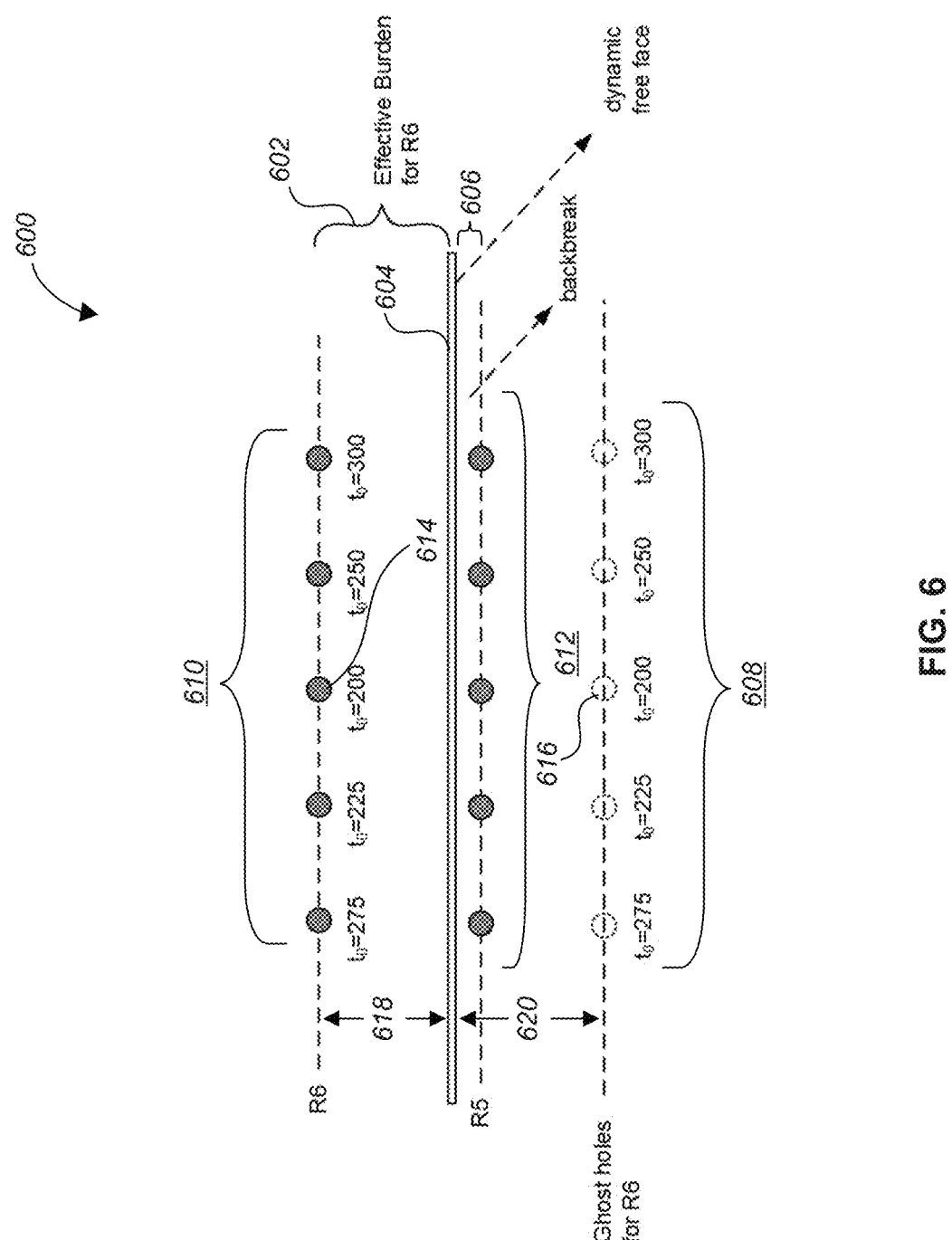
FIG. 6 illustrates a top planar view of a blast model with ghost holes and a dynamic free face in accordance with one embodiment.

FIG. 6 illustrates a top planar view of a blast model 600 with ghost holes 608 and a dynamic free face 604. The blast model 600 comprises multiple rows of blastholes (i.e., row R5 612, and row R6 610). The blastholes in row R5 612 have previously been blasted. Before the blastholes of row R5 612 were blasted, the dynamic free face 604 was in front of row R5 612 to include row R5 612 in the bench. The modeling system has moved the dynamic free face 604 to behind row R5 612 representing the rock elements broken off of the bench during the blast of row R5 612. Moving the dynamic free face 604 allows the modeling system to more accurately determine the effects of reflected shock waves. In this example, $t_0$ is the firing time and $R_i$ are the rows fired (i 1, 2, . . . n).

As each row is fired during the simulation, the modeling system dynamically moves the dynamic free face 604. Moving the dynamic free face 604 may help avoid remeshing and include back break effects in the blast model 600. When a row is fired, it creates back break 606 and a new free face as shown by the dynamic free face 604. The dynamic free face 604 will move as we fire additional rows in the time.

Back break 606 is the distance between a row previously fired and a new location of the dynamic free face 604. Whenever a row is fired, the rock elements in line with the row and between the row and a previous free face are dislodged. Additionally, in some embodiments some rock elements behind the row (e.g., rocks further from the previous free face than the blasted row) are also dislodged. For example, the distance between the row R5 612 and the dynamic free face 604 is the back break 606. In some embodiments, the back break 606 may be one third of the burden. In some embodiments, the dynamic free face 604 may be varied such that a burden of the plurality of blastholes varies at different y-axis elevations of the model.

The back break 606 changes the burden for the next row to be fired. The effective burden 602 is the spacing between rows minus the back break 606. The effective burden 602 is used to determine the placement of the ghost holes 608. The ghost holes 608 are placed a distance equivalent to the effective burden 602 away from the dynamic free face 604. In other words, the distance 618 between the row R6 610 and the dynamic free face 604 is equal to the distance 620 between the dynamic free face 604 and the ghost holes 608. The ghost holes 608 are positioned on an opposite side of the dynamic free face 604 relative to the row R6 610.

The ghost holes 608 initiate shock waves at the same time as the shock waves from the blastholes of row R6 610. The shock waves from the ghost holes 608 reach the dynamic free face 604 at the same time as the shock waves from the blastholes of row R6 610 and simulate shock waves reflected off of the dynamic free face 604. Accordingly, the ghost holes 608 follow the same timing as the row R6 610. That is, whenever one of the blastholes in row R6 610 is fired a corresponding ghost hole is fired. For example, when a first blasthole 614 is fired at 200 milliseconds (ms) and a shock wave is emitted, simultaneously a shock wave is emitted from a first ghost hole 616. Similarly, in the illustrated embodiment the remaining pairs of blastholes and ghost holes are fired at 225 ms, 250 ms, 275 ms, and 300 ms.

The dynamic free face 604 may be created for any blast pattern or timing sequence. Additionally, by using the dynamic free face 604, the modeling system may avoid remeshing when simulating a large problem with multiple rows and holes.

Figures 7A, 7B:
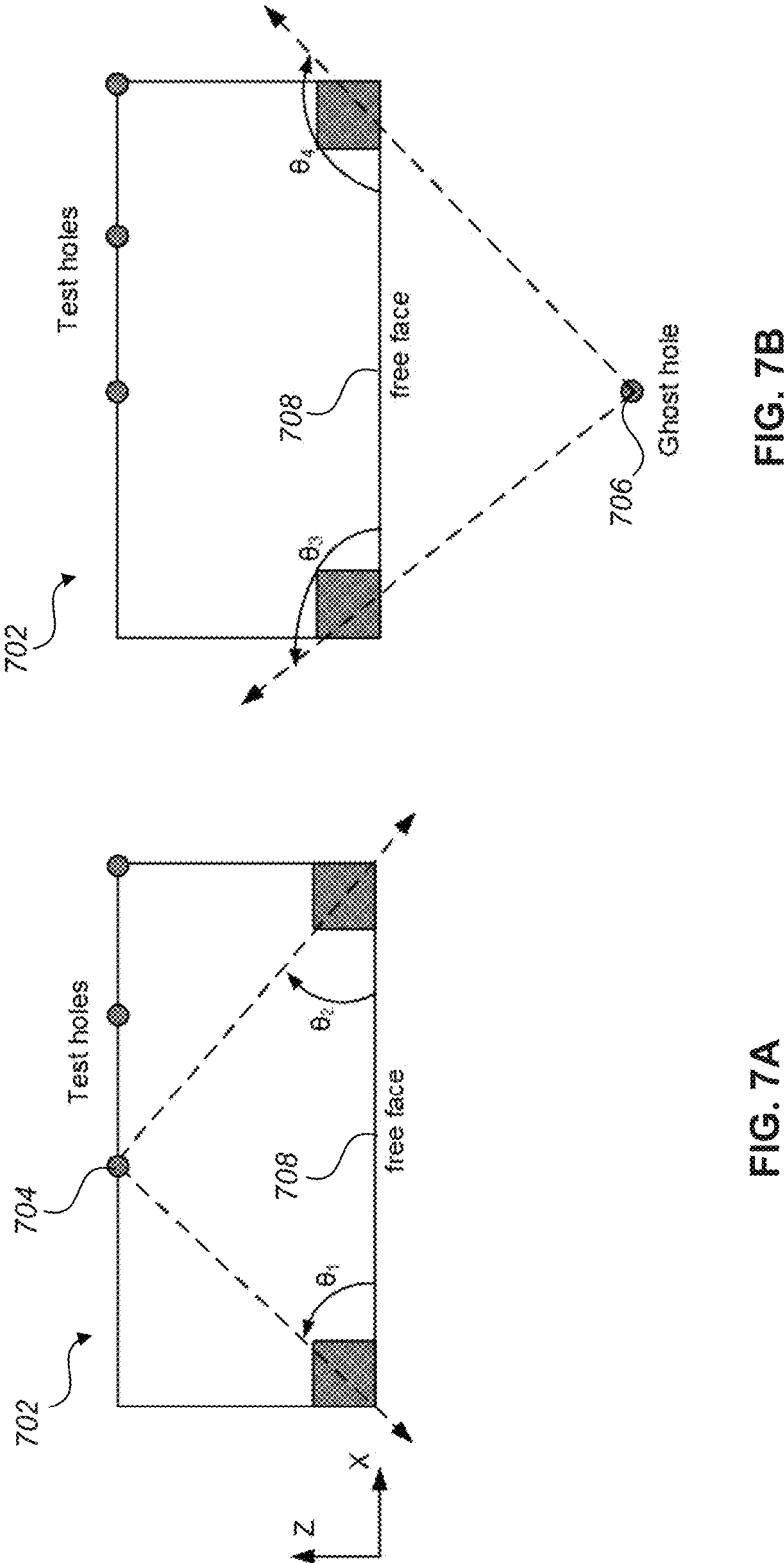
FIG. 7A illustrates a top planar view of a blast model and fracture angles from a first blasthole in accordance with one embodiment.
FIG. 7B illustrates a top planar view of a blast model and fracture angles from a ghost hole corresponding to the first blasthole in accordance with one embodiment.

FIGS. 7A and 7B illustrate how a modeling system may define fracture angles. Fracture angles are defined as the angle of actual shock waves and reflected shock waves. FIG. 7A illustrates a top planar view of a blast model 702 and fracture angles from a first blasthole 704. The angle of the shock wave from the first blasthole 704 may be determined by a modeling system by finding the angles between the free face 708 and the incident shock wave direction. More specifically, the angles for the incident shock wave are the angles between an interior side of the free face 708 and the incident wave direction.

Similarly, FIG. 7B illustrates a top planar view of a blast model 702 and fracture angles from a ghost hole 706 corresponding to the first blasthole 704. As shown, the angles from the reflected shock waves of the ghost hole 706 may be calculated also from the interior side of the free face 708 and the reflected wave direction.

In some embodiments, the angles are considered to be positive. Additionally, if the position of the blast hole is changed in the vertical direction (y direction), the modeling system may use direction cosines to accurately locate the charge in a plane (x-z plane). Calculation and preservation of the dominant angles of fracture intensity may be used by the system. For example, parallel fractures may cooperate while the orthogonal fractures interfere with each other. The system may recognize the order in which fractures arrive and considers the interaction of newly generated fractures with existing fractures in each volume element, for each hole that fires.

Figure 8:
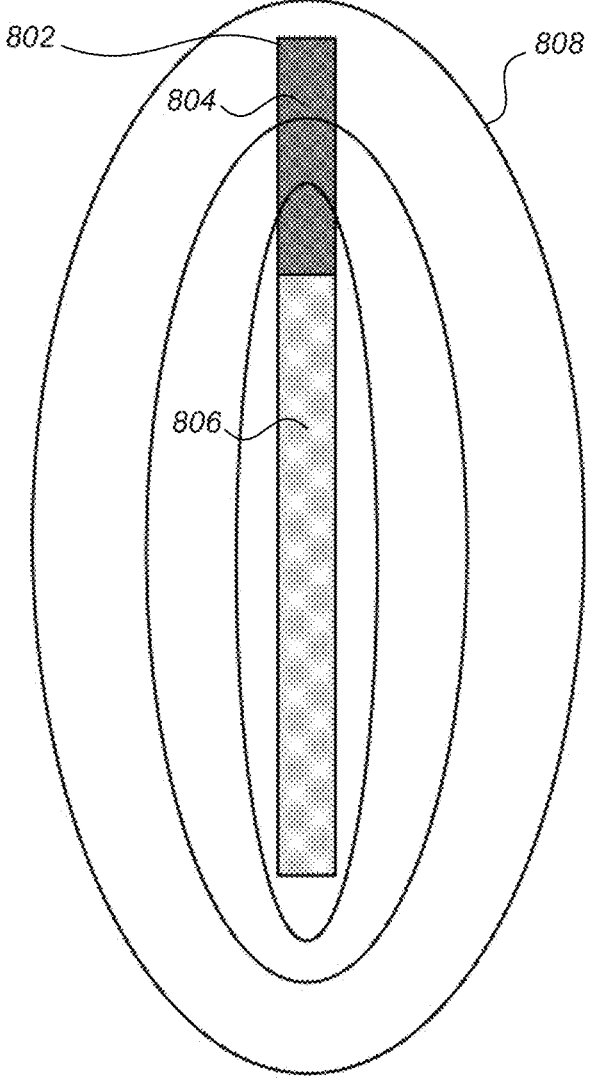
FIG. 8 illustrates a side view of a blasthole in accordance with one embodiment.

FIG. 8 illustrates a side view of a blasthole 802. As shown, the blasthole 802 includes stemming 804 and an explosive charge 806. In some embodiments, a modeling system may use the illustrated double ArcTan function elliptical shape fracture intensity contours 808 to determine the fragment sizes for each element of a 3D model and produce a fragmentation size distribution. The fracture intensity contours 808 may be centered around the explosive charge 806.

In some embodiments, the FDM modeling system may integrate FDM with multiple geologic layers and multiple decks. The geologic layers and multiple decks may be inputs to the FDM modeling system.

Figure 9A:
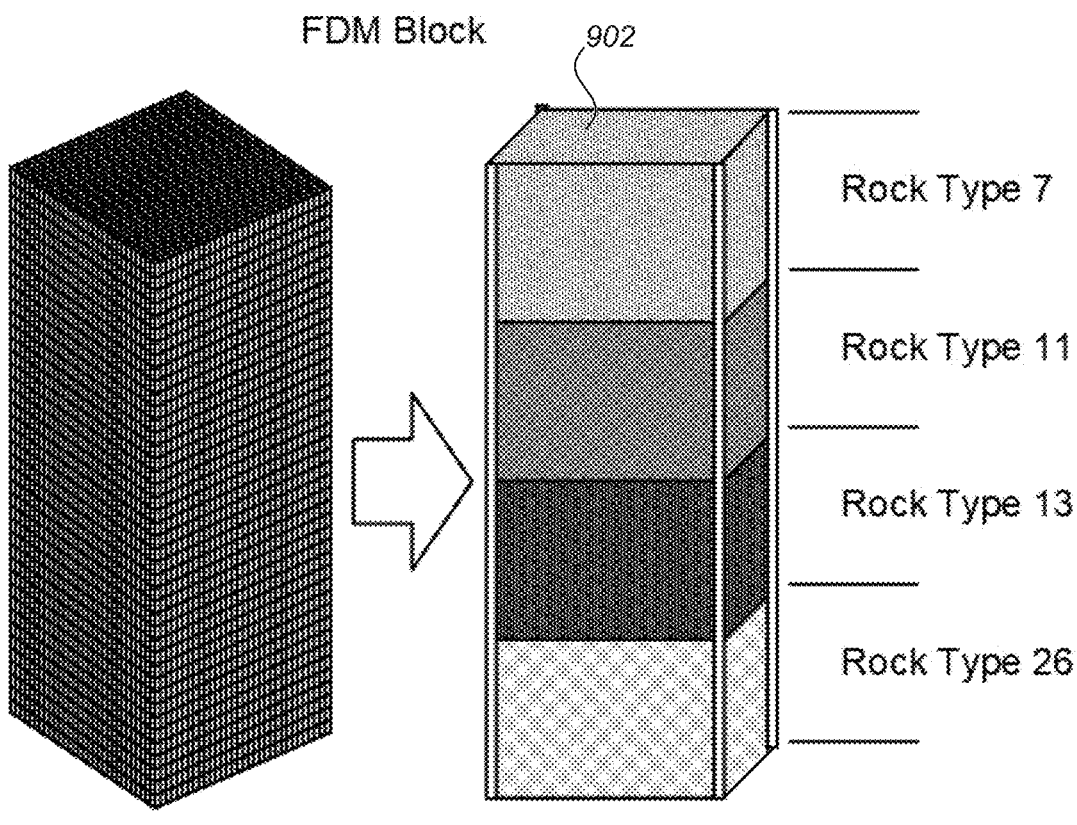
FIG. 9A illustrates a 3D model that incorporates rock type properties that may be used to more accurately predict fracture intensities in accordance with one embodiment.

FIG. 9A illustrates a 3D model that incorporates rock type properties to more accurately predict fracture intensities. Each rock layer (also referred to as a geologic layer) may be associated with rock properties including density, fracture toughness, and modulus. These rock properties may affect how the elements in each rock layer fracture. For example, a less dense rock may permit a fracture to extend further than a denser rock.

An input to the FDM modeling system representing geologic layers in a borehole, or blast pattern could be applied to the FDM analysis. The geologic layers could be layers with different geologic properties (e.g., rock type, porosity, hardness, etc.) The FDM modeling system may use the geologic properties to adjust how the rocks fracture based on the geologic properties such that different geologic layers may fracture differently. For example, the explosive fractures in each of the plurality of volume elements is affected by which of the geologic layers the plurality of volume elements are located within.

Non-limiting examples of geologic properties include mineralogy (elemental and/or mineral), lithologic structure (primary, secondary, and/or texture), porosity, hardness, rock strength, and density. "Texture" refers to the size, shape, and arrangement of the interlocking mineral crystals which form a rock or other material. The geologic properties may be used to determine further geologic characteristics, such as friability and fragmentability. The geologic properties may be determined directly or indirectly from sources such as seismic data, drilling data, drill cuttings, core samples, or combinations thereof. For example, drill cuttings and/or core samples may be analyzed using x-ray or gamma-ray fluorescence, scanning electron microscopy, and other spectroscopy and/or microscopy techniques. The geologic data may include information on an incremental basis, such as on a per foot basis.

In some embodiments, the geologic properties of the geologic layers may be obtained from drilling data. The drilling data may be captured by sensors on a smart drill. The drilling data may include information such as drill bit size, drill bit rotary speed, drill bit torque, penetration rate, bit vibration, pull down pressure, bailing air pressure, hole location, hole number, and hole length or depth. The drilling data may correlate to the geologic properties along the length of the blasthole. Thus, drilling data can be used to generate hardness values along the length of the blasthole (i.e., the hardness profile).

Figure 9B:
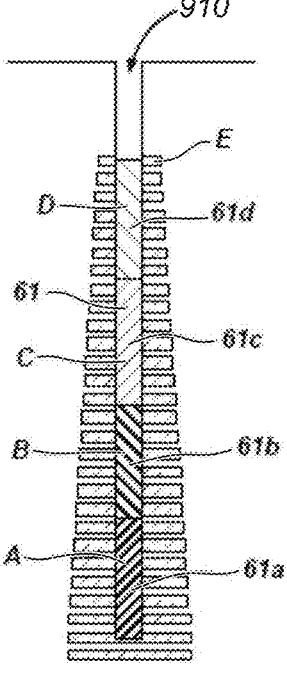
FIG. 9B illustrates a cross-section of a vertical blasthole with multiple decks.

FIG. 9B illustrates a cross-section of a vertical blasthole 910 with multiple decks. The decks may be segments with different explosive energy. For example, each segment may have different emulsion densities or ANFO energy density. The vertical blasthole 910 may be filled with explosive product 61 (e.g., sensitized product) comprising a first explosive product 61a conveyed with a first explosive energy A, second explosive product 61b conveyed with a second explosive energy B, third explosive product 61c conveyed with a third explosive energy C, and fourth explosive product 61d conveyed with a fourth explosive energy D. It should be understood that explosive product 61 may further comprise additional segments conveyed with different explosive energy. The explosive energy in each deck may be set to match the hardness of the rock in that layer. Rock layer hardness can be in any random order with depth. Thus, deck explosive energy can be arranged in any order within the blasthole. The explosive energy may be filled in an order that attempts to match geologic properties with an adjacent explosive product with explosive energy matching the geologic properties.

FIG. 9B illustrates the relative explosive energy distribution along blasthole 910 with bar graph E on either side of blasthole 910. Even though explosive product 61 is illustrated with four different conveyed densities, the relative explosive energy distribution, in some embodiments, may gradually change from the top of explosive product 61 to the bottom of explosive product 61. In some embodiments, the explosive energy distribution within each deck may remain constant or nearly constant and each deck may include an explosive energy selected based on the geologic properties within that deck.

The FDM modeling system may use explosive layering as an input for preparing fracturing models. The explosive layering could be layering of densities of emulsion, or layering of explosive energy of an explosive product (e.g., ANFO).

In some embodiments, the FDM modeling system may use both explosive layering and geologic layers when preparing fracturing models. In some models, the geologic layers and the explosive energy layers may match up. In other models, the geologic layers and explosive energy layers do not match up.

Figure 10:
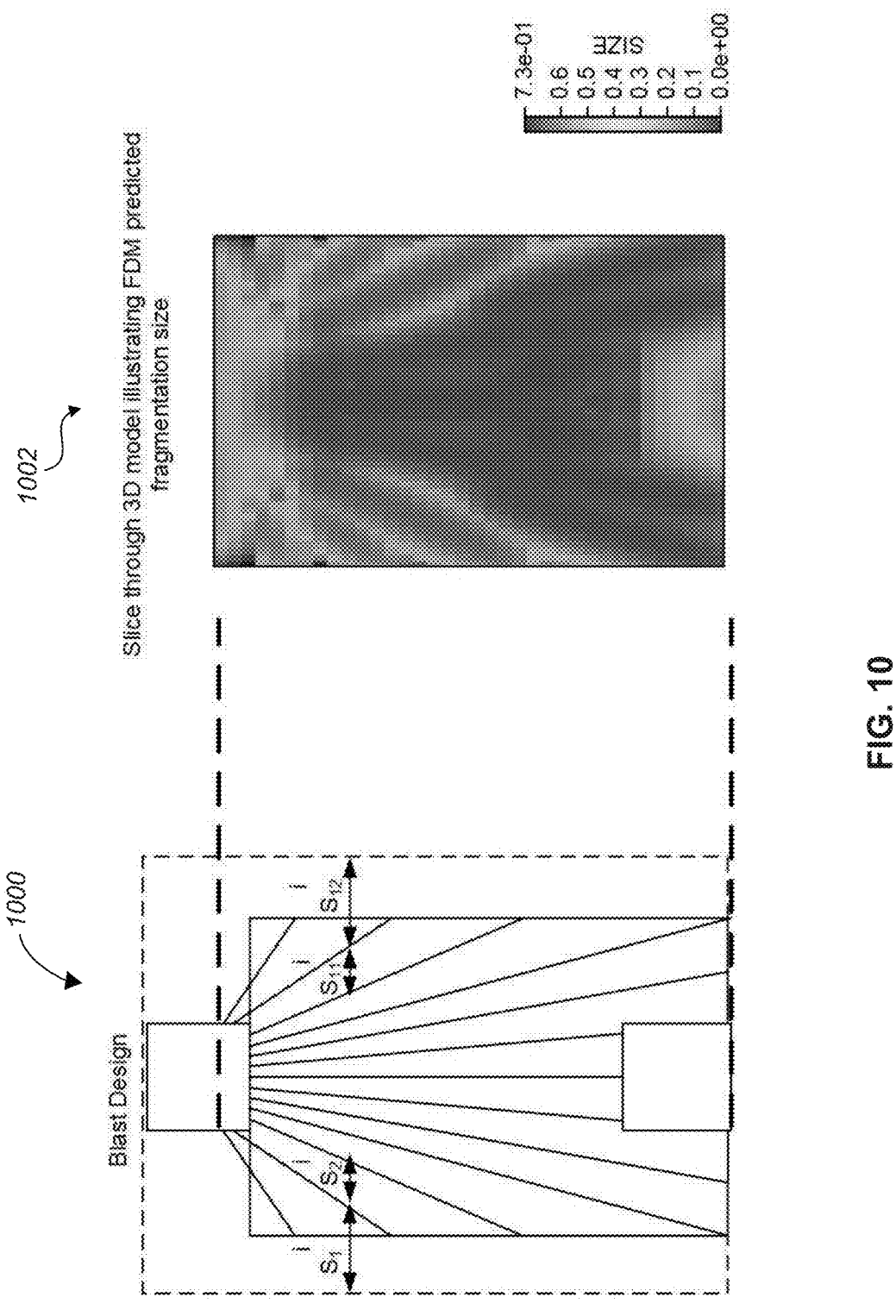
FIG. 10 illustrates a simulation of an underground mining stope model using FDM in accordance with one embodiment.

FIG. 10 illustrates a simulation of an underground mining stope model 1000 using FDM. As shown in the illustrated example, a modeling system may simulate angled blast holes with different charge lengths were using FDM. As can be seen, physical parameters like charge length, stemming, and spacing may be varied in different sub zones of the model.

To determine the fragmentation size and fragmentation intensities, the modeling system may generate blast parameters by reading charge top and bottom co-ordinates and calculating other parameters using vector distance equations as described with reference to FIG. 4. The fracture intensities may then be calculated as described herein.

FIG. 10 also illustrates a plot distribution of fragment sizes 1002. Near the blastholes the blast produces very fine particle size rocks. The plot distribution of fragment sizes 1002 shows fragmentation in different subzones of the model. Bigger particles can be shown with a gradient. The plot distribution of fragment sizes 1002 may be used to check a model and to add more fidelity to the 2D particle size distribution plot.

FIG. 11 illustrates a flow chart of a method 1100 for predicting rock fragmentation size resulting from a blast. In a modeling system using the method 1100 would use a model of a blast site. The blast site model may include blasthole data and blasting site data. Blasthole data may include blasthole parameters such as blasthole spacing, blasthole burden, blasthole depth, blasthole diameter, blasthole pattern, the number of blastholes, stemming information, explosive properties, blasthole angle, blasthole position, row offsets, backbreak, front-row burden, top coordinates of the blasthole, bottom coordinates of the blasthole, subdrill information, and decking information. In some embodiment, the method 1100 may include selecting an explosive type to be used, selecting a charge length, and positioning the charge in the plurality of blastholes.

Blasting site data may include bench information and geological properties of the blast site. Non-limiting examples of bench information includes face angle, bench height, bench dip, pit dip, free face location, and spoil angle. Non-limiting examples of geological properties include mineralogy (elemental and/or mineral), lithologic structure (primary, secondary, and/or texture), porosity, hardness, attenuation, Young's Modulus, Shear Modulus, Bulk Modulus, Poisson Ratio, P wave velocity, S wave velocity, rock density, rock type, rock strength, rock conditions, rock description, joint condition, joint angle, joint orientation, standard deviation of joint spacing, cohesion, vertical joint spacing, horizontal joint spacing, unconfined compressive strength (UCS), sonic velocity, standard deviation of drilling, shock velocity, fracture toughness of rock, reflectivity of rock, tensile strength of rock, internal friction angle, Hugoniot data (e.g., Up min, Up max, Us min, Us max), and ground stresses ($\sigma1$, $\sigma2$, $\sigma3$, stress orientation, dip, direction, and roll). "Texture" refers to the size, shape, and arrangement of the interlocking mineral crystals which form a rock or other material. The geology properties may be used to determine further geologic characteristics, such as friability and fragmentability.

The modeling system may segment 1102 the blast site model into a plurality of volume elements. The modeling system may track fracture intensities within each volume element throughout a simulated blast. For example, the modeling system may determine 1104 pre-existing joint fractures in the plurality of volume elements. The modeling system may simulate 1106 blasts from each of the plurality of blastholes, and determine 1108 fractures from the explosions (explosive fractures) in the plurality of volume elements. The blasts may be simultaneous or sequential. If sequential, after each blast, the modeling system may record fractures intensity created by the blast.

In some embodiments, the modeling system may simulate 1110 a shock wave reflection at a free face of the model by simulating blasts at a plurality of ghost holes beyond the free face to determine reflective fractures in the plurality of volume elements. The modeling system may combine 1112 the pre-existing joint fractures, the explosive fractures, and the reflective fractures to determine a total fracture intensity in the plurality of volume elements. The modeling system may convert the total fracture intensity associated with each volume element to determine a fragmentation size for each volume element, and provide 1114 a predicted fragmentation size distribution for the model based on the total fracture intensity in the plurality of volume elements.

In some embodiments, the modeling system may use a dynamic free face. The modeling system may move the dynamic free face after a row is blasted. For example, the system may move the free face after a first row is blasted to a position behind the first row to account for back break. In some embodiments, the free face may be moved behind the first row by one third of the burden. The new location of the dynamic free face may then be used for the blast of the next row. The moving free face may cause a difference in the placement of the ghost holes. For example, in some embodiments, the ghost holes are positioned distance from the free face equal to the distance between the blastholes and the free face. The ghost holes therefore may be considered mirrored blastholes, where the blastholes are on a first side of the free face and the ghost holes are on a second side of the free face.

The method 1100 may be used before blastholes are drilled, after blastholes are drilled, or after a blast has occurred. For example, the method 1100 may be used to plan a blast that has not yet been performed or it may be used to estimate the fragmentation sizes of a blast that has already been performed. For instance, after a blast has been completed, but before equipment has started removal of the muck pile, the system could run the simulation based on knowledge of how the blast actually occurred. Therefore, holes that were overcharged, undercharged, failed to detonate properly, partially filled with water, etc. could be input into the simulation and the mine engineer would have an updated expectation of what fragmentation was generated by blast. In some embodiments, the system may also predict throw from the blast and predict fragmentation size regions in the muck pile. In some embodiments, the muck pile and frag size prediction could be used to calculate cost and time to remove material from the blast site and the time and cost involved in milling the ore.

Figure 12:
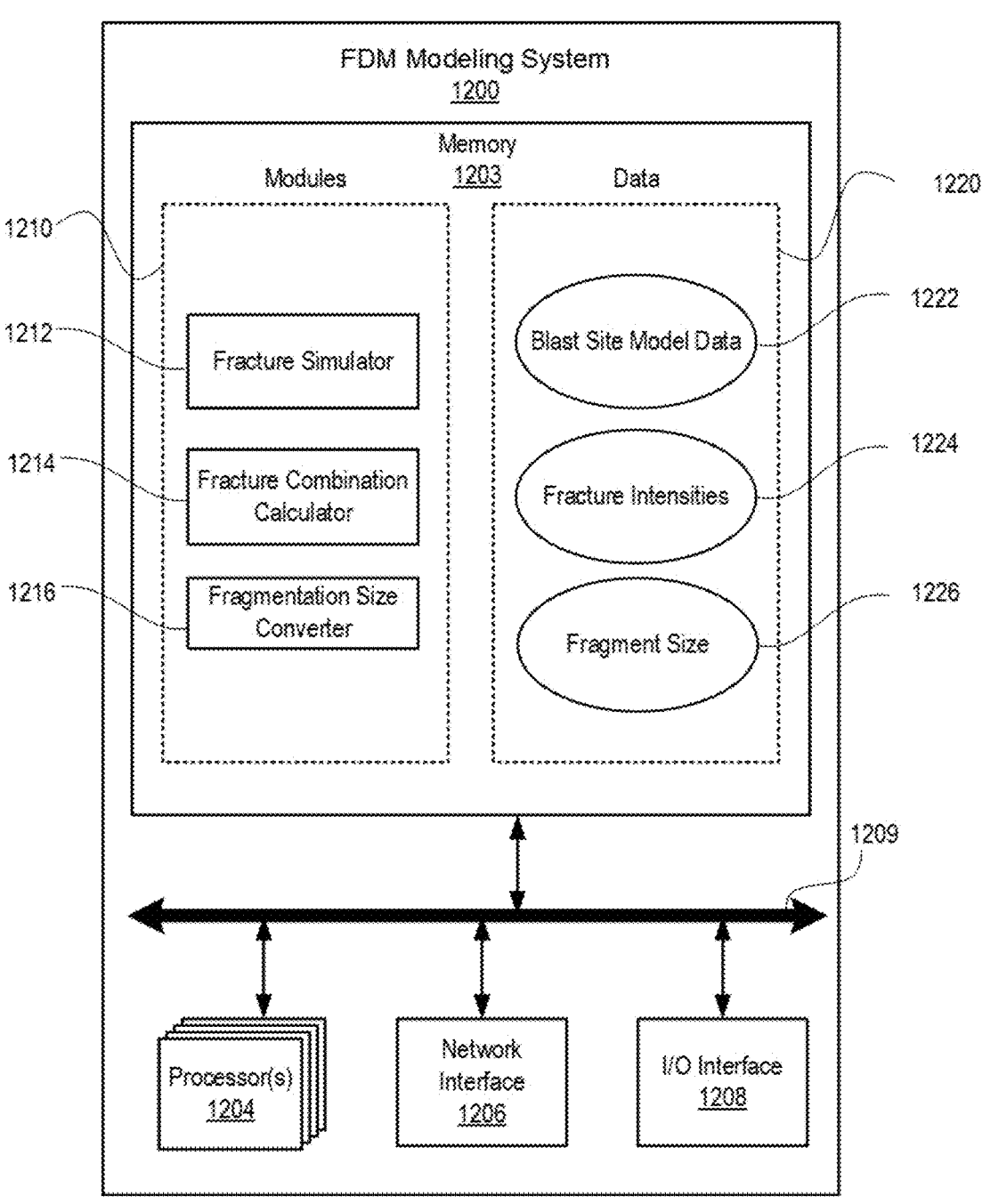
FIG. 12 is a block diagram of an FDM system according to one embodiment in accordance with one embodiment.

FIG. 12 is a block diagram of a FDM modeling system 1200 according to one embodiment. The FDM modeling system 1200 may perform the methods and use the techniques described with reference to the other figures in the specification. The FDM modeling system 1200 can include a memory 1203, one or more processors 1204, a network interface 1206, an input/output interface 1208, and a system bus 1209.

The one or more processors 1204 may include one or more general purpose devices, such as an Intel®, AMD®, or other standard microprocessor. The one or more processors 1204 may include a special purpose processing device, such as ASIC, SoC, SiP, FPGA, PAL, PLA, FPLA, PLD, or other customized or programmable device. The one or more processors 1204 can perform distributed (e.g., parallel) processing to execute or otherwise implement functionalities of the presently disclosed embodiments. The one or more processors 1204 may run a standard operating system and perform standard operating system functions. It is recognized that any standard operating systems may be used, such as, for example, Microsoft® Windows®, Apple® MacOS®, Disk Operating System (DOS), UNIX, IRJX, Solaris, SunOS, FreeBSD, Linux®, ffiM® OS/2® operating systems, and so forth.

The memory 1203 may include static RAM, dynamic RAM, flash memory, one or more flip-flops, ROM, CD-ROM, DVD, disk, tape, or magnetic, optical, or other computer storage medium. The memory 1203 may include a plurality of program modules 1210 and program data 1220. The memory 1203 may be local to the FDM modeling system 1200, as shown, or may be distributed and/or remote relative to the FDM modeling system 1200.

Data generated or used by the FDM modeling system 1200, such as by the program modules 1210 or other modules, may be stored on the memory 1203, for example, as stored program data 1220. The data 1220 may be organized as one or more databases.

The data 1220 may include blast site model data 1222, fracture intensities 1224, and contact, fragment size 1226. The blast site model data 1222 may be entered by a user through the input/output interface 1208 or received from other sources such as a smart drill and a Computer-Generated Blast design system. In some embodiments, the blast site model data 1222 may include blasthole, bench information, explosive information, natural joint information, and geology input data. In some embodiments, the FDM modeling system 1200 may be connected to a smart drill comprising sensors to obtain rock properties for subsequent fragmentation modeling. Geologic properties of the volume elements may be based on the smart drill data. The geologic properties may affect the way each volume element fragments. In some embodiments, the FDM modeling system 1200 may be linked with a Computer-Generated Blast design system to create the blast layout for subsequent fragmentation modeling. In some embodiments, the FDM modeling system 1200 may read explosive properties from each hole by utilizing Individual Blast Hole Analysis data. The fracture intensities 1224 may include fractures for each of a plurality of volume elements of the blast site model. In some embodiments, the fracture intensities 1224 are stored in sets for each volume element with each set comprising a natural joint intensity, a fracture intensity from each simulated blasthole blast, and a fracture intensity from reflected shock waves from each simulated blasthole blast. The fragment size 1226 data may record a fragment size associated with each volume element based on the fracture intensities 1224.

The program modules 1210 may include all or portions of other elements of the FDM modeling system 1200. The program modules 1210 may run multiple operations concurrently or in parallel by or on the one or more processors 1204. In some embodiments, portions of the disclosed modules, components, and/or facilities are embodied as executable instructions embodied in hardware or firmware, or stored on a non-transitory, machine-readable storage medium. The executable instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing compo-
nents, interface components, hardware controller(s), storage
controller(s), programmable hardware, FPGAs, ASICs, and/
or the like. Accordingly, the modules disclosed herein may
be referred to as controllers, layers, services, engines, facili-
ties, drivers, circuits, subsystems, and/or the like.

The modules 1210 may comprise a fracture simulator
1212, a fracture combination calculator 1214, and a frag-
mentation size converter 1216. The fracture simulator 1212
may simulate blasts from each blasthole and reflected shock
waves from a plurality of associated ghost holes. The
fracture simulator may also track the fracture intensities
1224 from the simulated blasts. The fracture combination
calculator 1214 may combine the fracture intensities. The
fragmentation size converter 1216 may convert the total
fracture intensities of each volume element into a fragment
size 1226. In some embodiments, the modules 1210 of the
FDM modeling system 1200 may be utilized to do a detailed
blast analysis. The detailed blast analysis may include: a 2D
PSD plot, a 3D PSD, and predict the location of large
boulders. In some embodiments, the modules 1210 of the
FDM modeling system 1200 may be used to optimize the
blast design/blast layout (e.g., burden, spacing ratios, hole
diameter, explosive energy, etc.) to obtain a desired frag-
mentation profile. For example, the FDM modeling system
1200 may receive an input specifying a desired fragmenta-
tion size and perform a plurality of different simulations
using multiple blast designs to determine a final blast design
(e.g., burden between rows, hole spacing, hole diameter,
explosive energy, etc.) that results in the desired fragmen-
tation size. The final blast design may be output to a
graphical user interface (GUI). In some embodiments, the
final blast design may be used to control one or more of
blasthole drilling, blasthole loading, and/or detonation
sequencing.

The input/output interface 1208 may facilitate user inter-
action with one or more input devices and/or one or more
output devices. The input device(s) may include a keyboard,
mouse, touchscreen, light pen, tablet, microphone, sensor, or
other hardware with accompanying firmware and/or soft-
ware. The output device(s) may include a monitor or other
display, printer, speech or text synthesizer, switch, signal
line, or other hardware with accompanying firmware and/or
software. For example, in one embodiment, the input/output
interface 1208 comprises a display to provide a graphical
user interface (GUI) illustrating the potential ablation perim-
eters. The input/output interface 1208 can receive the user
input data 1222. In some embodiments, the input/output
interface 1208 is a touchscreen, and the size input is received
via the touchscreen. In some embodiments, the input/output
interface 1208 can superimpose the target ablation perim-
eters on an image of the tissue.

The network interface 1206 may facilitate communication
with other computing devices and/or networks and/or other
computing and/or communications networks. In some
embodiments, the network interface 1206 may communicate
with one or more of a smart drill, blast design system, and
an explosive delivery truck. The network interface 1206 may
be equipped with conventional network connectivity, such
as, for example, Ethernet (IEEE 1102.3), Token Ring (IEEE
1102.5), Fiber Distributed Datalink Interface (FDDI), or
Asynchronous Transfer Mode (ATM). Further, the network
interface 1206 may be configured to support a variety of
network protocols such as, for example, Internet Protocol
(IP), Transfer Control Protocol (TCP), Network File System
over UDP/TCP, Server Message Block (SMB), Microsoft®
Common Internet File System (CIFS), Hypertext Transfer Protocols (HTTP), Direct Access File System (DAFS), File
Transfer Protocol (FTP), Real-Time Publish Subscribe
(RTPS), Open Systems Interconnection (OSI) protocols,
Simple Mail Transfer Protocol (SMTP), Secure Shell (SSH),
Secure Socket Layer (SSL), and so forth.

The system bus 1209 may facilitate communication and/
or interaction between the other components of the FDM
modeling system 1200, including the one or more processors
1204, the memory 1203, the input/output interface 1208, and
the network interface 1206.

EXAMPLE

The following example is illustrative of disclosed meth-
ods. In light of this disclosure, those of skill in the art will
recognize that variations of these examples and other
examples of the disclosed method would be possible without
undue experimentation.

Example 1—Test Results Using United States Bureau of Mines Data

The United States Bureau of Mines (USBM) conducted a
series of 29 small scale shots at the University of Missouri
Rolla's experimental site and screened the blasted rocks in
order to generate the fragment size distribution plot (Otter-
ness et. al, 1991). The shots had 3 or 4 blast holes with a
delay time of 1-4 ms per foot of burden. Other design
parameters varied were bench height, burden, spacing, stem-
ming, and hole diameter. Table 1 shows the range of
parameters that were used in USBM test (all units are in
inch). The benches used for the shots were in a massive
dolomite formation, and the charges used were of extra
dynamite with a density of 1.12 gm/cc. FDM was set up to
simulate these 29 USBM bench blast shots.

TABLE 1

| Range of physical parameters used in USBM 29 test (Otterness et. al, 1991) |
| --- |
| Burden: 10 to 30 |
| Spacing: 12.5 to 42 |
| Bench height: 17 to 89 |
| Hole diameter: 0.4375 to 1.0 |
| Stemming: 8 to 20 |

A three-dimensional (3D) mesh with approximately
20,000 discrete volume elements were created to represent
the USBM bench blast geometry. Equations 2-5 were used
to predict the intensity of fracture at each volume element.
The fracture intensities were then converted to an equivalent
size assigned to each element. Numerical bins were used to
screen the sizes and generate a fragment size distribution
curve. In order to calibrate equations 2-5 and find out the
best set of parameters (K, $\alpha$, $\gamma$, $\delta$), the root mean squared
error (RMSE) between the experimental and numerical
dataset was calculated. Several thousand optimization itera-
tions were conducted to minimize the RMSE error and
finally find out a best parameter set to represent the 29
USBM shots.

Figures 13A, 13B:
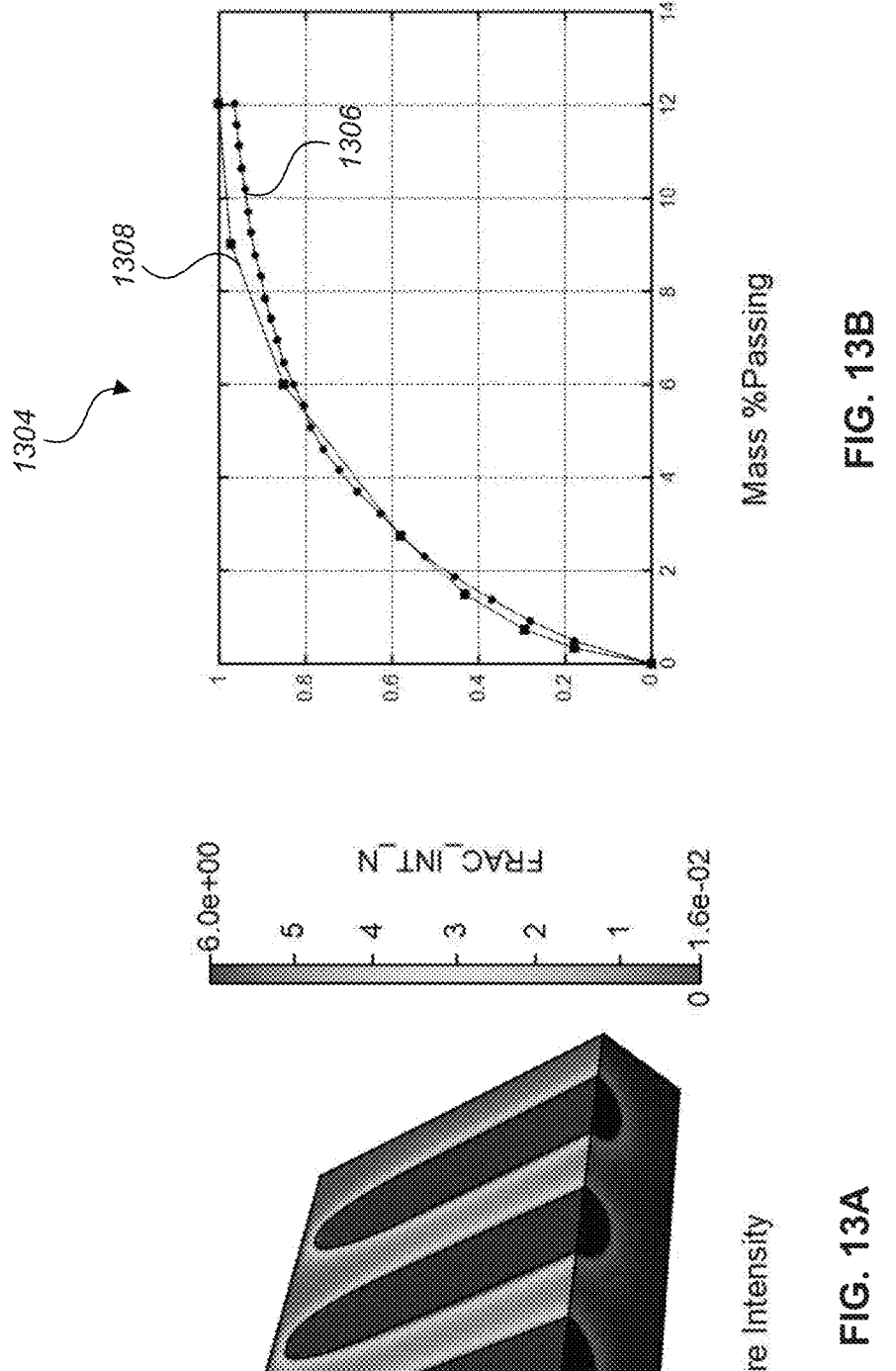
FIG. 13A illustrates a 3D FDM contour plot of fracture intensity of a 3D blast model with a plurality of discrete elements in accordance with one embodiment.
FIG. 13B illustrates a 2D particle size distribution curve in accordance with one embodiment.

FIG. 13A illustrates a 3D FDM contour plot 1302 of
fracture intensity of a 3D blast model with a plurality of
discrete elements. Specifically, FIG. 13A shows a three-
dimensional FDM contour plot of fracture intensity for one
of the 29 USBM shots. As can be seen, near the blast holes
there is a very high intensity of fracture. This high intensity
corresponds to a very small rock size close to the blast holes.

Further away from the holes, the intensity attenuates and consequently the rock sizes increase.

FIG. 13B illustrates a 2D particle size distribution curve 1304. The 2D particle size distribution curve 1304 agrees well with the experimental data from the USBM. To obtain the 2D particle size distribution curve 1304, the modeling system used the fracture intensities and converted them to an equivalent size assigned to each element. The modeling system used numerical bins were used to screen the sizes and generated a fragment size distribution curve. The 2D particle size distribution curve 1304 illustrates the percentage of rocks able to pass through various screen sizes.

The 2D particle size distribution curve 1304 includes a predicted fragment size distribution curve 1306 using FDM and an actual fragment size distribution curve 1308. As can be seen, the predicted fragment size distribution curve 1306 agrees well with the actual fragment size distribution curve 1308.

Figure 14:
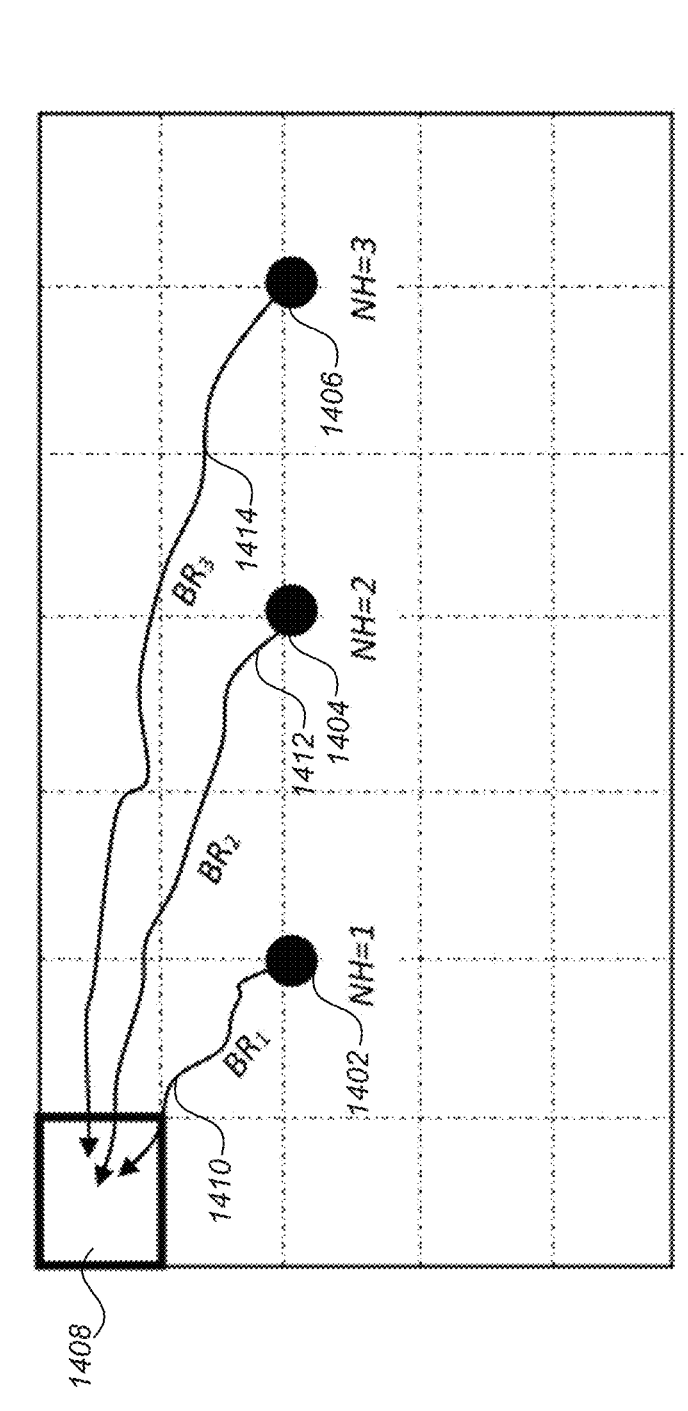
FIG. 14 illustrates a top planar view of a blast model.

FIG. 14 illustrates a top planar view of a blast model 1400. In the illustrated embodiment, the 3D blast model 1400 comprises three blast holes shown as circles (first blasthole 1402, second blasthole 1404, and third blasthole 1406) and a plurality of rock elements shown as boxes with dashed boundaries (e.g., FDM element 1408). As shown, three cracks (e.g., first crack 1410, second crack 1412, and third crack 1414) are coming out of the blastholes. The cracks are illustrated by zigzag lines with an arrow at the end representing the direction in which the crack was formed.

Timing is an important blast design parameter. The timing between the holes in a row and the timing between the rows can significantly affect the rock fragmentation. Generally, a short delay time (simultaneous firing) or a very long delay time can result in poor fragmentation. There may be an optimum delay time that can result in the best fragmentation for a blast. In FDM, a system may treat the effect of delay timing as described below.

The crack arrival time from different blast holes to an element of interest (e.g., FDM element 1408) may be calculated by using Equation 8. Then, using a combination rule, the fracture frequencies may be combined in the sequence they arrived at the element of interest. This produces the resultant fracture frequency and fragmentation data for each element of interest. In Eqn. 8, $t_0(NH)$ is the firing time of a hole (NH), which is known from the delay time among the holes in a row and from the delay time among the rows.

$$\text{Time (crack arrival)} = \frac{\text{Distance from hole to element center } (BR)}{\text{Crack speed } (V_c)} + t_0(NH) \quad \text{(EQUATION 8)}$$

As seen in FIG. 14, the cracks reach the element of interest from the blast holes (NH=1, NH=2, & NH=3) by traveling distances of $BR_1$, $BR_2$, and $BR_3$ respectively. Crack speed ($V_c$) may be estimated as 30% of the sound speed in rock. These variables may be used to calculate crack arrival time in an element (using Eqn. 8) and then the system may combine the fracture intensities in the sequence they arrived at the element from different holes.

In some embodiments, a system may modify the fracture intensities based on the delay time between the holes. The system may then combine the fracture intensities in a sequence (as described above) to generate the resultant FDM fracture intensities. The modifications of fracture intensities may reflect the quality of fragmentation based on the delay time. For example, a very short delay is likely to produce poor fragmentation and an optimum delay is likely to produce a good fragmentation.

Any methods disclosed herein comprise one or more steps or actions for performing the described method. The method steps and/or actions may be interchanged with one another. In other words, unless a specific order of steps or actions is required for proper operation of the embodiment, the order and/or use of specific steps and/or actions may be modified.

While specific embodiments of blast modeling systems and methods have been illustrated and described, it is to be understood that the disclosure provided is not limited to the precise configuration and components disclosed. Various modifications, changes, and variations apparent to those of skill in the art having the benefit of this disclosure may be made in the arrangement, operation, and details of the methods and systems disclosed, with the aid of the present disclosure.

Without further elaboration, it is believed that one skilled in the art can use the preceding description to utilize the present disclosure to its fullest extent. The examples and embodiments disclosed herein are to be construed as merely illustrative and exemplary and not a limitation of the scope of the present disclosure in any way. It will be apparent to those having skill, having the benefit of this disclosure, in the art that changes may be made to the details of the above-described embodiments without departing from the underlying principles of the disclosure herein.

What is claimed is:

1. A method for explosive blast modeling, the method comprising:
   segmenting a model of at least a portion of a blast site into a plurality of volume elements, wherein the model comprises a plurality of blastholes and a free face;
   determining pre-existing joint fractures in each of the plurality of volume elements;
   simulating blasts from each of the plurality of blastholes;
   determining explosive fractures in each of the plurality of volume elements from the blasts from each of the plurality of blastholes;
   simulating a shock wave reflection at a free face of the model by simulating blasts at a plurality of ghost holes beyond the free face to determine reflective fractures in each of the plurality of volume elements, wherein the ghost holes are positioned in free space and not in direct contact with rock elements of the model;
   combining the pre-existing joint fractures, the explosive fractures, and the reflective fractures to determine a total fracture intensity in each of the plurality of volume elements;
   determining fragmentation sizes for each of the plurality of volume elements based on the total fracture intensity; and
   controlling, in response to the fragmentation sizes meeting a desired fragmentation size, one or more blasting equipment based on the model.

2. The method of claim 1, wherein the blasts are sequential and explosive fractures and reflective fractures are determined after each blast.

3. The method of claim 1, wherein the plurality of blastholes comprises rows that are to be blasted sequentially, and wherein the method further comprises generating a new free-face for the model after each row is blasted.

4. The method of claim 3, wherein the new free face is positioned one third of a burden distance from a previously blasted row.

5. The method of claim 1, wherein the explosive fractures and the reflective fractures are determined using rock properties, explosive properties, and distance from a blasthole.

6. The method of claim 1, wherein the plurality of ghost holes are positioned an equal distance from the free face as a next blast hole to be blasted.

7. The method of claim 1, wherein force from the plurality of ghost holes is modeled as a tensile wave with a first angle and force from the plurality of blastholes is modeled as a compressive wave at a second angle.

8. The method of claim 1, wherein the simulated blasts at the plurality of ghost holes and the simulated blasts at the plurality of blastholes occurs at the same time.

9. The method of claim 1, further comprising summing a total of different fragmentation sizes to achieve a predicted fragmentation size distribution for the model.

10. The method of claim 1, wherein the explosive fractures are determined by solving the following equations for each of the plurality of volume elements:

$$F = K * F1 * F2 * F3$$

$$F1 = \left( \frac{\frac{\sigma_c^2}{2E}}{PF * EE} \right)^{\delta}$$

$$F2 = \left[ \frac{R_0}{R} \left( \tan^{-1} \frac{HMX}{R} + \tan^{-1} \frac{XMS}{R} \right) \right]^{\alpha}$$

$$F3 = \left( \frac{BR}{R_0} \right)^{\gamma}$$

where F1 corresponds to rock and explosive properties;
F is an explosive induced fracture intensity;
K is a site-specific calibration parameter;
F2 is a shape of a particle size distribution curve;
F3 is an intensity effect;
EE is an explosives energy;
PF is a powder factor;
E is energy available from explosives;
$\sigma_c$ corresponds to a rock strength described by a strain energy density;
$\alpha$, $\gamma$, and $\delta$ are variables calculated using test bench blast shots;
Ro corresponds to the hole radius;
R is the radial orthogonal distance of an element from the hole;
BR is the distance of an element from the blasthole, (BR differs from Rin stemming zone);
HMX and XMS are distance functions evaluated for blasthole orientation using vector distance equations; and the exponents a, Y, and 6 are calibrated using test bench blast shots.

11. The method of claim 1, wherein the free face is varied such that a burden of the plurality of blastholes varies at different y-axis elevations of the model.

12. A method for explosive blast modeling, the method comprising:
 segmenting a model of at least a portion of a blast site into a plurality of volume elements, wherein the model comprises rows of blastholes;
 determining pre-existing joint fractures in the plurality of volume elements; sequentially simulating blasts for each of the rows of blastholes; determining explosive fracture intensities in the plurality of volume elements from the blasts, wherein fractures from the blasts are determined after each of the rows of blastholes is detonated;

simulating a shock wave reflection from the blasts at a free face of the model by simulating blasts at a plurality of ghost holes beyond the free face to determine reflective fracture intensities in the plurality of volume elements, wherein the ghost holes are positioned in free space and not in direct contact with rock elements of the model, and wherein the free face location is shifted after each of the rows of blastholes is detonated and fractures from the shock wave reflection are determined after each of the rows of blastholes is detonated using the location of the free face;
 combining the pre-existing joint fractures, the explosive fracture intensities, and the reflective fracture intensities to determine a total fracture intensity in the plurality of volume elements;
 predicting fragmentation sizes for the plurality of volume elements based on the total fracture intensity; and
 controlling, in response to the fragmentation sizes meeting a desired fragmentation size, one or more blasting equipment based on the model.

13. The method of claim 12, wherein the plurality of ghost holes are positioned an equal distance from the free face as a next row of blastholes to be blasted.

14. The method of claim 12, wherein force from the plurality of ghost holes is modeled as a tensile wave with a first angle and force from the rows of blastholes is modeled as a compressive wave at a second angle.

15. The method of claim 12, wherein the simulated blasts at the plurality of ghost holes are synchronous with a simulated blast of a next row of blastholes.

16. A method for explosive blast modeling, the method comprising:
 segmenting a model of at least a portion of a blast site into a plurality of volume elements, wherein the model comprises one or more blastholes and multiple geologic layers;
 determining pre-existing joint fractures in each of the plurality of volume elements;
 simulating blasts from the one or more blastholes;
 determining explosive fractures in each of the plurality of volume elements from the blasts from each of the one or more blastholes, wherein the explosive fractures in each of the plurality of volume elements are affected by which of the geologic layers the plurality of volume elements is located within;
 determining reflective fractures based on blasts from virtual holes positioned in free space on an opposite side of a free face of the model relative to the one or more blastholes;
 combining the pre-existing joint fractures and the explosive fractures and the reflective fractures to determine a total fracture intensity in each of the plurality of volume elements;
 determining fragmentation sizes for each of the plurality of volume elements based on the total fracture intensity; and
 controlling, in response to the fragmentation sizes meeting a desired fragmentation size, one or more blasting equipment based on the model.

17. The method of claim 16, wherein the geologic layers comprise rock properties for different portions of in a borehole or a blast pattern.

18. The method of claim 17, wherein the rock properties are obtained from drilling data.

19. The method of claim 16, wherein the model further comprises explosive layering, wherein the explosive layering comprises an explosive product with varying explosive energy within the one or more blastholes, and wherein the explosive fractures in each of the plurality of volume elements is based on the explosive layering.

* * * * *